US009001858B1

(12) United States Patent
Hirayama et al.

(10) Patent No.: US 9,001,858 B1
(45) Date of Patent: Apr. 7, 2015

(54) QUANTUM CASCADE LASER ELEMENT

(71) Applicant: Riken, Saitama (JP)

(72) Inventors: Hideki Hirayama, Saitama (JP); Tsung-Tse Lin, Saitama (JP); Miho Sasaki, Saitama (JP)

(73) Assignee: Riken, Wako-shi (JP)

( * ) Notice: Subject to any disclaimer, the term of this patent is extended or adjusted under 35 U.S.C. 154(b) by 0 days.

(21) Appl. No.: 14/281,531

(22) Filed: May 19, 2014

(30) Foreign Application Priority Data

Oct. 31, 2013 (JP) .................. 2013-226195

(51) Int. Cl.
*H01S 5/00* (2006.01)
*H01S 5/34* (2006.01)
*H01S 5/06* (2006.01)

(52) U.S. Cl.
CPC ............. *H01S 5/3425* (2013.01); *H01S 5/0614* (2013.01)

(58) Field of Classification Search
USPC .................................... 372/45.012
See application file for complete search history.

(56) References Cited

U.S. PATENT DOCUMENTS

| | | | | |
|---|---|---|---|---|
| 6,829,269 B2* | 12/2004 | Goodhue et al. | ........... | 372/43.01 |
| 7,158,545 B2* | 1/2007 | Hu et al. | ........... | 372/4 |
| 7,558,305 B2* | 7/2009 | Botez et al. | ........... | 372/43.01 |
| 7,843,981 B2 | 11/2010 | Yamanishi et al. | | |
| 7,848,376 B2* | 12/2010 | Masselink et al. | ........ | 372/45.011 |
| 7,856,042 B2* | 12/2010 | Botez et al. | ........... | 372/45.012 |
| 8,014,430 B2* | 9/2011 | Patel et al. | ........... | 372/45.012 |
| 2006/0215718 A1* | 9/2006 | Yasuda et al. | ........... | 372/45.012 |
| 2008/0219308 A1 | 9/2008 | Yamanishi et al. | | |
| 2008/0273565 A1* | 11/2008 | Gmachl et al. | ........... | 372/45.012 |
| 2011/0080930 A1* | 4/2011 | Liu et al. | ........... | 372/45.012 |

FOREIGN PATENT DOCUMENTS

JP 2008-60396 A 3/2008

OTHER PUBLICATIONS

Kumar et al., "A 1.8 THz quantum cascade laser operating significantly above the temperature of hw/kB," Nature Physics, DOI: 10.1038/NPHYS1846: 166-171, Dec. 12, 2010.
Kumar et al., "A 1.8 THz quantum cascade laser operating significantly above the temperature of hw/kB," Supplementary Information, Nature Physics, DOI: 10.1038/NPHYS1846, 13 pages.

* cited by examiner

*Primary Examiner* — Xinning Niu
*Assistant Examiner* — Vu A Vu
(74) *Attorney, Agent, or Firm* — Seed IP Law Group PLLC

(57) ABSTRACT

To raise the upper limit of the temperature range in which a quantum cascade laser (QCL) element for THz range operates at a single frequency. In a quantum cascade laser element in one embodiment of the present invention, each unit structure 10U in the active region 10 is provided with the first to fourth well layers 10W1-10W4 that are stacked in this order and separated from one another by at least one bather layer 10B. During application of a first bias electric field for lasing, the structure of electronic energy levels has a reception, upper lasing, lower lasing, and depopulation levels and emits electromagnetic waves at a first frequency. During application of a second bias electric field that is weaker than the first bias electric field, the overlap integral is 0.15 or less between electronic wavefunctions for the unnecessary upper lasing and unnecessary lower lasing levels, thereby stimulated emissions of electromagnetic waves are suppressed at frequencies other than the first frequency.

8 Claims, 13 Drawing Sheets

QUANTUM CASCADE LASER ELEMENT

CROSS REFERENCE TO RELATED APPLICATIONS

This application is based upon and claims the benefit of priority to Japanese Patent Application No. 2013-226195, filed on Oct. 31, 2013, the contents of which are incorporated herein by reference in its entirety.

TECHNICAL FIELD

The present invention relates to a quantum cascade laser element. More specifically, the present invention relates to a quantum cascade laser element that emits electromagnetic waves in the terahertz frequency range.

BACKGROUND ART

Recently, a quantum cascade laser, hereinafter abbreviated as "QCL", is gathering much attention as a solid state light source that radiates, or emits, electromagnetic (EM) waves in the mid infrared (MIR) and the terahertz (THz) frequency ranges.

A typical QCL element is equipped with a semiconductor superlattice (SSL) which forms undulation of potentials for electrons inside, the potentials having repeating pairs of a well and a barrier. Upon application of an external voltage to the QCL element for operation, the potential for an electron in the SSL becomes inclined generally along a thickness direction while having the undulating pattern with the wells and barriers. The electron as a carrier of electric charge makes intersubband transitions repeatedly while being transported and emits EM waves through stimulated emission, leading to lasing operation. The expression "cascade" in the name has been given in association with the action of electrons, during which each electron loses its energy through such intersubband transitions while being transported. This action allows QCL elements to utilize their conduction carriers, or electrons, for stimulated emissions in a repeated manner, which is called "carrier recycling". As stated above, the emission mechanism in QCLs is significantly different from one in conventional semiconductor lasers.

It is possible for QCL elements to cause lasing operation with a wavelength that has no relationship with an energy gap of the material used for the SSL. The lasing wavelength can be tuned through designing process of the SSL. For these reasons, QCL elements have attracted much attention as coherent light sources in the mid infrared and the THz ranges, for both of which wavelength or frequency ranges no solid state light source has been developed.

The EM waves in the THz range, among other things, have both properties of lights and radio waves. That is, EM waves in THz range indicate high resolution capability of lights and high transmission capability of radio waves, while adverse effects on target object are reduced in comparison with the case with X-ray radiation or the like. From this nature, the EM waves of the THz range are expected to be used in material identification through transmission and in fluoroscopic examination of human body. From a practical point of view, what is regarded as promising is QCLs with THz range radiation (THz-QCLs) that is capable of emitting radiation through the stimulated emission at the particular frequency as designed. Therefore, such THz-QCL elements need "band engineering", in which thickness values of well and barrier layers in the SSL are carefully designed in consideration of, such as, the inclination of potential by electric field and detailed physical phenomena, and, on top of that, such SSL should be manufactured into actual devices. One measure to evaluate the practicality of THz-QCLs is an upper limit of temperature range in which lasing operation is carried out at intended operation frequencies (hereinafter referred to as "operation temperature").

Elements of three-level type have been developed for the conventional QCL elements, including THz-QCLs as well as ones operating in the mid infrared range. In such type of QCLs, three electronic energy levels (hereinafter simply referred to as "levels") for each stimulated emission in each repeating unit structure are related to the carrier transport and transitions. What is utilized in the three-level type QCLs is, in addition to the upper and lower lasing levels over which a population inversion is formed for lasing, a depopulation level with lower energy value than the lower lasing level. The depopulation level plays two roles: one is to depopulate electrons from the lower lasing level, and the other is to transport and inject electrons into an upper lasing level in the next stage, or downstream in the flow direction of the electrons. The electrons in the depopulation level are transported by tunneling of resonant tunneling effect when they are transported and injected into the upper lasing level in the unit structure downstream thereto. Such a mechanism is called resonant tunneling injection, or "RT injection". To realize the RT injection it is necessary to match energy values with precision between a level, or a depopulation level in a unit structure, in which the stimulated emission in one stage occurs, and another level, or an upper lasing level in the unit structure next to it where the stimulated emission in the next stage occurs. Such an operation is achieved only when a limited and narrow condition is satisfied, thus it has been difficult to have a broad dynamic range in the current density in the three-level type QCLs that use the RT injection. In addition to that, when a large number of electrons exist in the upper lasing level in the next stage, a phenomenon called "carrier stagnation" may occur. The carrier stagnation is often observed when the population inversion is formed between the upper and lower lasing levels in the next stage.

The above-mentioned problems have been overcome for mid infrared range QCLs with four-level type (Patent Document 1: JP 2008-60396 A. In the four-level type, another level with higher energy value than the upper lasing level is used in addition to the three level type, which is referred to as an injection level in the Patent Document 1. Electrons that act as electric charge carriers will once make a transition to the injection level, and then, while being mediated by LO (longitudinal optical) phonons, will be injected into the upper lasing level with high rate. This scheme is called an indirect pumping (IDP) scheme. The indirect pumping scheme alleviates or removes the problems of the dynamic range and the carrier stagnation.

REFERENCES

Patent Document

Patent Document 1: JP 2008-60396 A

Non-Patent Document

Non-Patent Document 1: S. Kumar, et. al., "A 1.8-THz quantum cascade laser operating significantly above the temperature of $h\omega/k_B$", Nature Phys. Vol. 7, 166-171 (2010), doi:10.1038/nphys1846

SUMMARY OF THE INVENTION

Technical Problem

The inventors of the present invention conducted research as to how the operating temperature of the THz-QCLs would be raised in a low frequency region, especially 2 THz or less. In so doing, we have applied an approach of design of the four-level type in the Patent Document 1 that has been proposed in connection with the mid infrared QCL elements to the THz-QCLs. As a result, we have found that several additional problems should be solved in the case of the THz-QCLs.

First of all, merely applying design concept of the four-level type to the THz-QCLs for THz range operation would lead to simultaneous injection, in which electrons are injected not only into the upper lasing level but also into the lower lasing level as well (simultaneous injection problem). This is because the photon energy in the THz-range is much smaller than in the mid infrared.

Moreover, carrier lifetime is decreased in the THz-QCLs as the electrons are scattered by the longitudinal optical (LO) phonons in the upper lasing level (carrier lifetime problem).

It is to be noted that application of four-level type concept to THz-QCLs has been reported. See, Non-Patent Document 1: S. Kumar, et. al. Nature Phys. 7, p 166 (2010). Non-Patent Document 1 reports that 1.8 THz pulse laser operation has been observed at 163 K (−110 degree C.). However, the operation achieved in Non-Patent Document 1 is related to two wavelengths (two frequencies). The QCL element in Non-Patent Document 1 cannot be concluded that lasing operation at a single frequency has been achieved, because the QCL element have actually generated lasing in around 4.0 THz, which is totally different from 1.8 THz. As such, there is a problem in the conventional approach for applying the four-level type design to THz-QCLs having lasing frequency in the lower THz range, in that lasing operation at a single frequency is difficult to realize, that is, such lasing operation accompanies two or more frequency (dual frequency lasing problem).

The present invention is to solve at least one of the problems mentioned above. That is, the present invention provides a single frequency lasing operation with higher operating temperature in QCL elements in lower THz range; thereby the present invention contributes to reduction into practice of applications in which THz-QCLs are utilized.

Solution to Problem

The inventors of the present application have found that the dual frequency lasing problem can be avoided even when the four-level type design is adopted in THz-QCLs that should operate lasing in the THz range. Specifically, we have found that another design scheme that focuses on wavefunctions of electrons is effective in achieving lasing operation at a single, target frequency.

Accordingly, in one aspect of the present invention, provided is a quantum cascade laser (QCL) element having a semiconductor superlattice sandwiched by a pair of electrodes. In this aspect, the semiconductor superlattice has an active region that emits electromagnetic waves of a first frequency in a THz range during application of an external voltage for operation through the pair of electrodes. The active region has a plurality of unit structures each of which is stacked with one another to form a multi-layered structure. In this aspect, each unit structure is made of first to fourth well layers that are stacked in this order and are separated from one another by at least one barrier layer. Moreover in this aspect, the energy level structure for an electron in one unit structure of the active region during application of a first bias electric field by the external voltage comprises at least a reception, upper lasing, lower lasing, and depopulation levels. The reception level receives an electron transported from an upstream unit structure disposed adjacent to one side of the one unit structure, and corresponds to the first well layer. The upper lasing level has a lower energy value than the reception level by a first energy difference associated with an LO phonon energy in a crystal lattice forming the semiconductor superlattice and receives an electron scattered by an LO phonon in the crystal lattice from the reception level. The upper lasing level corresponds to the second well layer. The lower lasing level has a lower energy value than the upper lasing level by a photon energy value of an electromagnetic wave for the first frequency and receives an electron, which has lost energy due to stimulated emission, from the upper lasing level. The lower lasing level corresponds to the third well layer. The depopulation level has a lower energy value than the lower lasing level by a second energy difference associated with the LO phonon energy, receives an electron scattered by LO phonons in the crystal lattice from the lower lasing level, and transports an electron toward a downstream unit structure disposed adjacent to the other side of the one unit structure. The depopulation level corresponds to the fourth well layer. In this aspect of the present invention, during application of a second bias electric field that is weaker than the first bias electric field, an unnecessary upper lasing level and an unnecessary lower lasing level are separated by an energy difference that is equivalent to a photon energy value corresponding to one of electromagnetic waves of frequencies different from the first frequency. The wavefunctions for an electron for unnecessary upper lasing and unnecessary lower lasing levels have an overlap integral value with each other of 0.15 or less. Here, the unnecessary lasing upper level is either of the reception level or the depopulation level in the upstream unit structure and is one that will have a high probability of existence of an electron in the first well layer during application of the second bias electric field; and the unnecessary lower lasing level is either of the upper lasing level or the lower lasing level and is one that will have a high probability of existence of an electron in the second well layer during application of the second bias electric field. In this aspect of the present invention, stimulated emissions of photons are suppressed for electromagnetic waves at frequencies different from the first frequency.

Barrier layers are provided between adjacent ones of the first to fourth well layers in each of the plurality of unit structures in the active region. The barrier layers and the well layers are made to have appropriate thickness through crystalline growth technique, such as molecular beam epitaxy (MBE), and they are included in the semiconductor superlattice (SSL). Each barrier layer acts as a potential barrier and each well layer acts as a potential well sandwiched by the potential barriers for electrons as electric carriers.

In operation condition, a reception level, an upper lasing level, a lower lasing level, and a depopulation level are associated with the first to fourth well layers respectively. These levels are ones with which an electron may have discrete energy values according to quantum mechanical effects. In this context, that an electron is "associated with" a well means that a weighted center in the thickness direction for the electron's probability of existence is positioned around the well, where the probability as each position is determined according to the wavefunction corresponding to the level. The wavefunctions for the reception, upper lasing, lower lasing, and depopulation levels are ones for an electron in the levels specified by suffixes of 1', 5, 4, and 2, respectively, from the higher to lower energy order under a bias electric field for operation, in the embodiment of the present invention below. In the present application, the reception, upper lasing, lower lasing and depopulation levels, or subbands, are also denoted by symbols of L1', L4, L5, and L2, and their minimum energies are denoted by E1', E5, E4, and E2, respectively. It is to be noted that the reception level in this specification corresponds to the injection level in the Non-Patent Document 1. The indication of prime (r) is used herein because the description in the specification follows a customary practice in the field of invention, in which the levels or wavefunctions accompanying the prime has been described to denote those in another unit structure with higher energy side, or upstream side. Furthermore, although there may be other levels than specifically described ones, such as one specified by suffix 3, such levels are unrelated to the lasing operation. Also, the energy values of electrons in the unit structure may include different ones from levels described above and one for continuum bands in the conduction band. In addition, the reason why the energy values are the "minimum" values is that the electrons may have energy values of parabolic shape in the reciprocal lattice space corresponding to directions of the plane of the layers.

The unnecessary upper lasing and unnecessary lower lasing levels are those that denoting some levels during the application of the second bias electric field, which is weaker than the first electric field. These levels will be described in detail in the embodiment.

In this application, the EM waves in THz range denotes, in general, ones in a frequency range of 0.1 THz to 30 THz, or ones in a wavelength range of 10 µm to 3 mm. The lower THz range means a frequency range of 2.0 THz or less in the THz range mentioned above. Structures or functions in the present application may be described using technical terms converted or borrowed from technological fields of electronic devices and physics that are related to visible lights or infrared rays to make the description clear. Therefore, even when EM waves at a frequency or wavelength range far different from those for the visible light are concerned, such terms as "laser", "light emission", or such prefixes as "optical-" or "photo-" may be adopted.

Advantageous Effect of the Invention

In quantum cascade lasers in any of the embodiments of the present invention, a high temperature lasing operation at a single wavelength, or at a single frequency, is realized even in an unprecedented low frequency range.

DESCRIPTION OF THE EMBODIMENT

Figure 1:
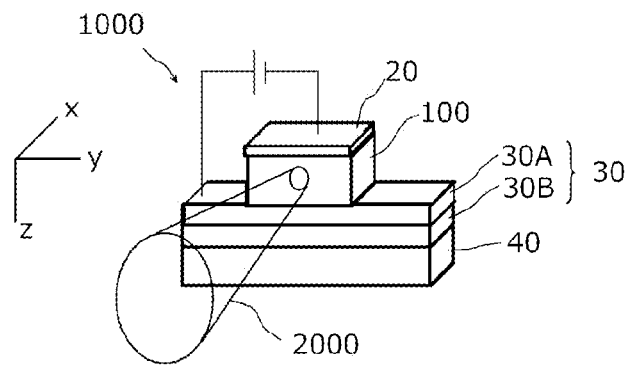
FIG. 1 illustrates a perspective view (FIG. 1a), an enlarged cross sectional view (FIG. 1b), and a further enlarged partial cross sectional view (FIG. 1c) showing general structure of a THz-QCL element in an embodiment of the present invention.
Figure 1:
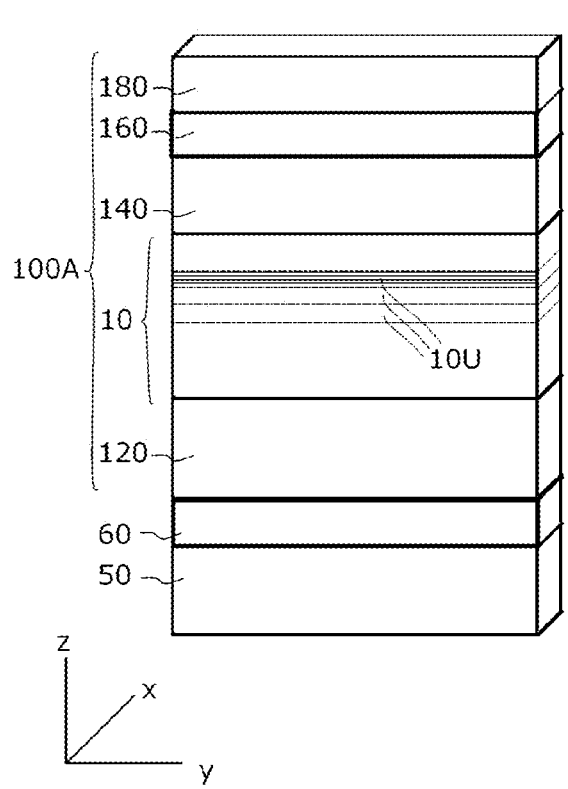
Figure 1:
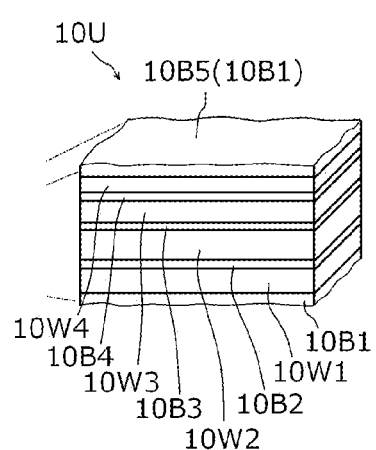

Quantum cascade lasers of the present invention will be described. For all drawings, the common reference signs are given to common parts or elements unless otherwise noted. Each element in the drawing should be understood as not being drawn to scale.

Structure of THz-QCL Elements in the Embodiment

FIG. 1 illustrates as perspective view (FIG. 1a), an enlarged cross sectional view (FIG. 1b), and a further enlarged partial cross sectional view (FIG. 1c) showing general structure of a THz-QCL element in the embodiment. Typical THz-QCL element 1000 as in FIG. 1a is generally equipped with a pair of electrodes 20 and 30 and a QCL structure 100 that is a semiconductor superlattice (SSL) sandwiched therebetween. The electrodes 20 and 30 are used for receiving from outside an electric voltage for producing an electric field and an electric current inside the QCL, structure 100 for emission, or radiation of EM waves. The electrodes 20 and 30 are made of metal and act as the optical confinement minors due to the cavity structure of the electrodes 20 and 30 where surface plasmons are induced upon excitation by the EM waves in the THz range. This structure is called a double metal wall (DMW) structure. The QCL structure 100 also has an active region 10. The THz-QCL element 1000 operates by allowing electrons to go through the repeating structure of electronic potentials in the thickness direction, where the repeating structures are formed in the active region 10 when the above-mentioned electric voltage is applied. The electrons go through the repeating structure, while they emit EM waves 2000 in a THz range through transitions between levels, or subbands. The electrode 30 is formed on a receptor substrate 40 (hereinafter referred to as "receptor 40") of the THz-QCL element 1000 in FIG. 1.

The active layer 10 (FIG. 1b) has plural unit structures 10U that are provided in a multi-layered manner along the thickness direction, where each unit structure 10U also has plural sets of alternatingly stacked well layer 10W and barrier layer 10B, to realize the above-mentioned operation. Each unit structure 10U has at least four well layers 10W (well layers 10W1 to 10W4) in this order. The well layers 10W are separated from one another by at least a barrier 10B. Individual barrier layers 10B may be referred to as barrier layers 10B1-10B5 from the substrate 50 side, when distinction is necessary among them.

The details of the unit structures 10U will be described. Of well layers 10W, the well layers 10W1 to 10W3 are made of $Al_xGa_{1.0-x}As$ (where $0 \leq x \leq 0.42$), which is a mixed crystal of AlAs and GaAs, whereas the well layer 10W4 is made of $Al_xGa_{1.0-x}As$, which is hereinafter referred to as "n-$Al_xGa_{1.0-x}As$", as the conduction type is made n type by doping. The doping may be carried out by modulation doping during the growth of the well layer 10W4, in such a manner that its electron density becomes $\sim 2.1 \times 10^{16}$ cm$^{-3}$. The barrier layer 10B in the present embodiment may have a composition of $Al_{0.15+x+y}Ga_{0.85-x-y}As$ (where $0 < y \leq 0.85-x$), which is also a mixed crystal of AlAs and GaAs. It is to be noted that x is identical to x in $Al_xGa_{1.0-x}As$ ($0 \leq x \leq 0.42$) for the composition of well layer 10W combined with the barrier layer 10B. Thus x denotes a fraction of aluminum ("Al composition ratio") in the sum of aluminum and gallium. If y is set to 0.85-x, then the Al composition ratio in the barrier 10B becomes 1.0. An illustrative example for the combination of x and v is (x, y)=(0.0, 0.025). Materials for this example are GaAs and $Al_{0.175}Ga_{0.825}As$ in the well and barrier layers, respectively. The more the Al fraction in the composition of barrier layers 10B is by increasing y above 0, the deeper the potential wells in the well layers 10W.

The QCL structure 100 (FIG. 1a) is formed by trimming off the extended periphery portion from layered structure for the SSL 100A (FIG. 1b). Typical SSL 100A is formed on, such as, a semi-insulating (SI) GaAs substrate 50 with plane orientation of (001), hereinafter referred to as "substrate 50". This typical example can be described as follows. An etch stop layer 60 ("ES layer 60") having 250 nm thick $Al_{0.6}Ga_{0.4}As$ or the like is formed on the surface of the substrate 50. Then, a highly doped n-type GaAs layer 120 of 800 nm thickness (typical electron density $\sim 3 \times 10^{18}$ cm$^3$) is formed on the surface of the ES layer 60. Thereafter, an active region 10 is formed, whose details will be descried later. A 100 nm thick highly doped n-type GaAs layer 140 (typical electron density $\sim 3 \times 10^{18}$ cm$^3$) is then formed on the surface of the active region 10. Then a delta-dope GaAs layer 160 having ten sets of 1 inn thick GaAs layer and a delta-dope layer of Si is formed; and lastly, a 5 nm thick low temperature grown GaAs layer (LTG-GaAs layer) 180 is formed. It should be noted that FIG. 1b indicates the stacked film structure formed on one surface of the substrate 50 in the order of the manufacturing process, from the bottom to the top in the drawing. The SSL 100A in FIG. 1b is indicated in an upside down view of the QCL structure 100 in FIG. 1a.

The unit structures 10U in the SSL 100A in FIG. 1b are formed in the active region 10 in a multi-layered manner having, such as, 10-200 stacks of identical structures. FIG. 1c depicts with enlarged view the structure of a single unit, or one period, of each unit structure 10U. The unit structure 10U has the barrier layers 10B and well layers 10W alternatingly layered with each other. The well layer 10W1 is disposed directly on the barrier layer 10B1, and the barrier layer 10B2 is disposed directly on the well layer 10W1. The rest is the same as the above. It should be noted that the barrier layer 10B5 is identical to barrier layer 10B1 in a unit structure 10U in the net period. Typical materials for the barrier layers 10B1 to 10B4 are commonly $Al_{0.15+1+y}Ga_{0.85-x-y}As$, whereas each of their thickness is different from one another. The well layers 10W1 to 10W4 also have substantially the same composition of $Al_xGa_{1.0-x}As$, whereas each of their thickness is from one another. As stated above, the unit structure 10U is manufactured in such a manner that it has four well layers of the well layers 10W1 to 10W4, or the first to fourth well layers respectively, and these well layers are separated by the barrier layers from one another.

A typical example design of the THz-QCL element 1000 in the present embodiment is specifically described in Table 1. The values in the last column for the working example in Table 1 will be described later.

TABLE 1

| Layer | Material Composition | Thickness (nm) Design | Thickness (nm) Working Example |
|---|---|---|---|
| Barrier Layer 10B1 | $Al_{0.175}Ga_{0.825}As$ | 4.0 | 3.95 |
| Well Layer 10W1 | GaAs | 8.0 | 7.99 |
| Barrier Layer 10B2 | $Al_{0.175}Ga_{0.825}As$ | 2.2 | 2.16 |
| Well Layer 10W2 | GaAs | 9.0 | 9.02 |
| Barrier Layer 10B3 | $Al_{0.175}Ga_{0.825}As$ | 3.2 | 3.19 |
| Well Layer 10W3 | GaAs | 6.9 | 6.86 |
| Barrier Layer 10B4 | $Al_{0.175}Ga_{0.825}As$ | 3.8 | 3.76 |
| Well Layer 10W4 | n-GaAs | 14.4 | 14.38 |
| Total, in one unit structure | | 51.5 | 51.31 |

The specific example design for the THz-QCL element 1000 provided in Table 1 has 185 repeats of the unit structures 10U that are formed in the active region 10. The frequency expected for the stimulated emission (target frequency, or the first frequency) in this specific example design is 1.9 THz, which corresponds to photon energy of 7.8 meV. The voltage to be applied between the pair of electrodes 20 and 30 is such that it produces a bias electric field of ~18 kV/cm within the SSL 100A. The polarity of the voltage is positive side to the electrode 30 and negative side to the electrode 20, as is indicated in FIG. 1a. The following description will be made based on the bias electric field actually produced within the active region 10 unless otherwise noted, instead of the voltage applied to the pair of electrodes 20 and 30.

Operation Temperature of Conventional THz-QCL Elements

Figure 2:
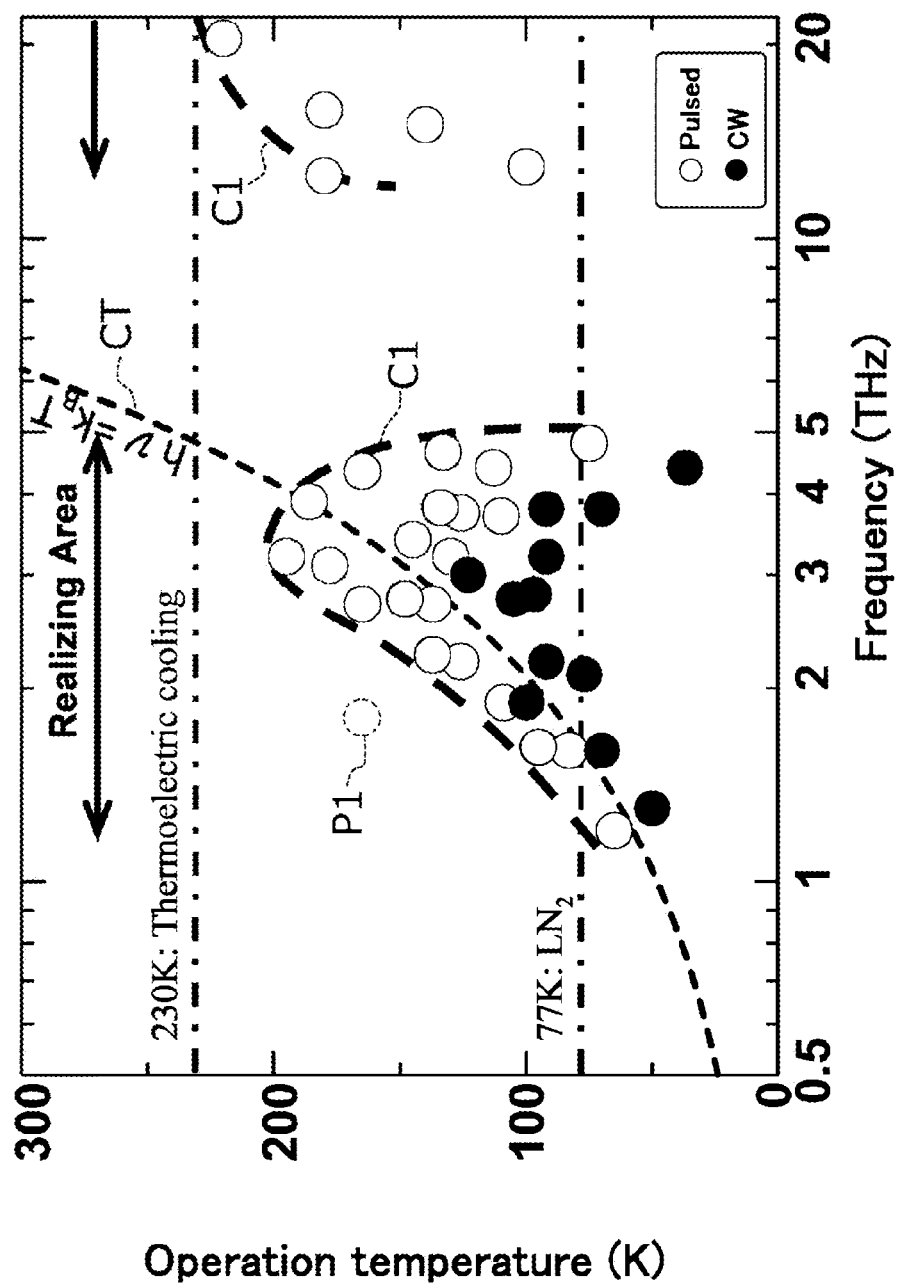
FIG. 2 is a mph on which operation temperatures are plotted at frequencies for conventional types of THz-QCL elements.

FIG. 2a depicts a graph on which operation temperatures are plotted in a frequency range for conventional types of THz-QCL elements. The operation temperature in this context is an upper limit of lasing operation for each element. As shown in FIG. 2, generally speaking, lasing operation has been achieved over 1.1 THz to 5 THz region with continuous wave or pulse operation. Even though some of the operation temperatures exceed liquid nitrogen temperature (77 K, or −196 degree C.), none of them reaches a sufficient temperature, or 230 K (−43 degree C.), that can be achieved by small scale cooling devices, such as thermo-electronic cooling with Peltier devices. Curve C1 indicates a boundary in the frequency and temperature space under which single frequency lasing operations are achieved by conventional THz-QCL elements. An empirical relationship has been found between frequencies of the EM waves for lasing and highest operation temperature achieved at the frequencies. Curve CT in FIG. 2 shows temperature measures for each frequency, or "frequency equivalent temperature", calculated on the assumption that photon energy hv at each frequency equals thermal energy $k_BT$, where h is Planck's constant, v is frequency, $k_B$ is Boltzmann constant, and T denotes the frequency equivalent temperature in absolute temperature. The operation temperatures achieved to date by conventional THz-QCL elements are distributed below a line of temperature limits that are 1.2 times the frequency equivalent temperatures, or curve CT, for each frequency. That is, it has been difficult for the conventional THz-QCL elements to operate lasing with a temperature that exceed 1.2 times of the frequency equivalent temperatures. The inventors of the present application believe that such difficulty is caused by the simultaneous injection problem and the carrier lifetime problem.

It should be noted that Non-Patent Document 1 reports that a THz-QCL element operated at an operation temperature of 1.9 times of the frequency equivalent temperature. That is, point P1 in FIG. 2 indicates the 1.8 THz lasing operation of the THz-QCL element in Non-Patent Document 1. However, the THz-QCL element in Non-Patent Document 1 accompanies lasing operation also at a frequency around 4 THz, not shown in the figures, which is totally different from 1.8 THz. Since the THz-QCL element in Non-Patent Document 1 suffers from the lasing operations at an untargeted frequency, or at an unwanted frequency, even though the lasing operation at 1.8 THz is targeted, the dual frequency lasing problem is unsolved.

Lasing Operation of THz-QCL Element in the Embodiment

Figure 3:
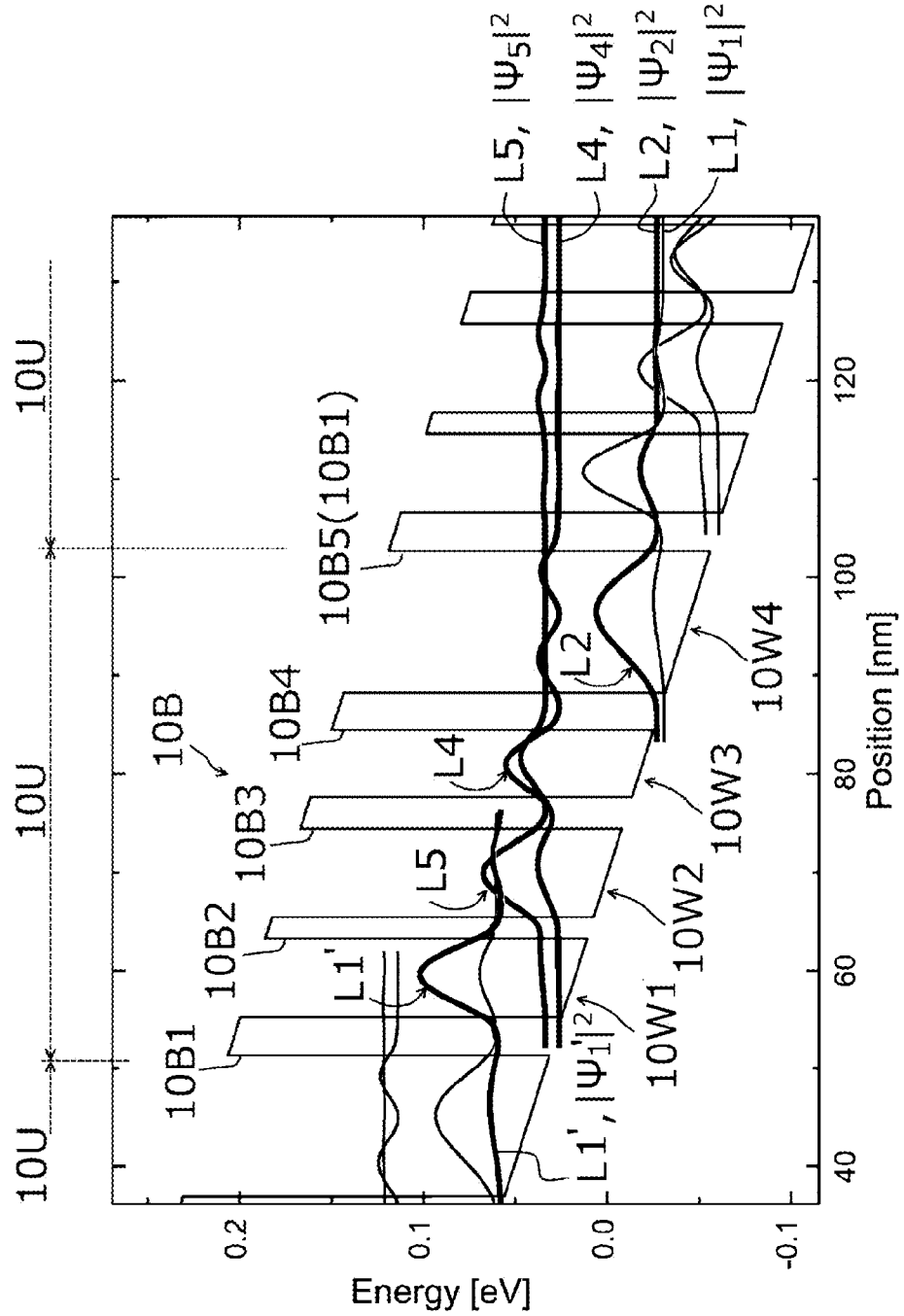
FIG. 3 is a mph showing positional dependence of a potential that acts on electrons and distributions of electron's probability of existence calculated by wavefunctions in each level, or each subband, in THz-QCLs in one embodiment of the present invention.
Figure 4:
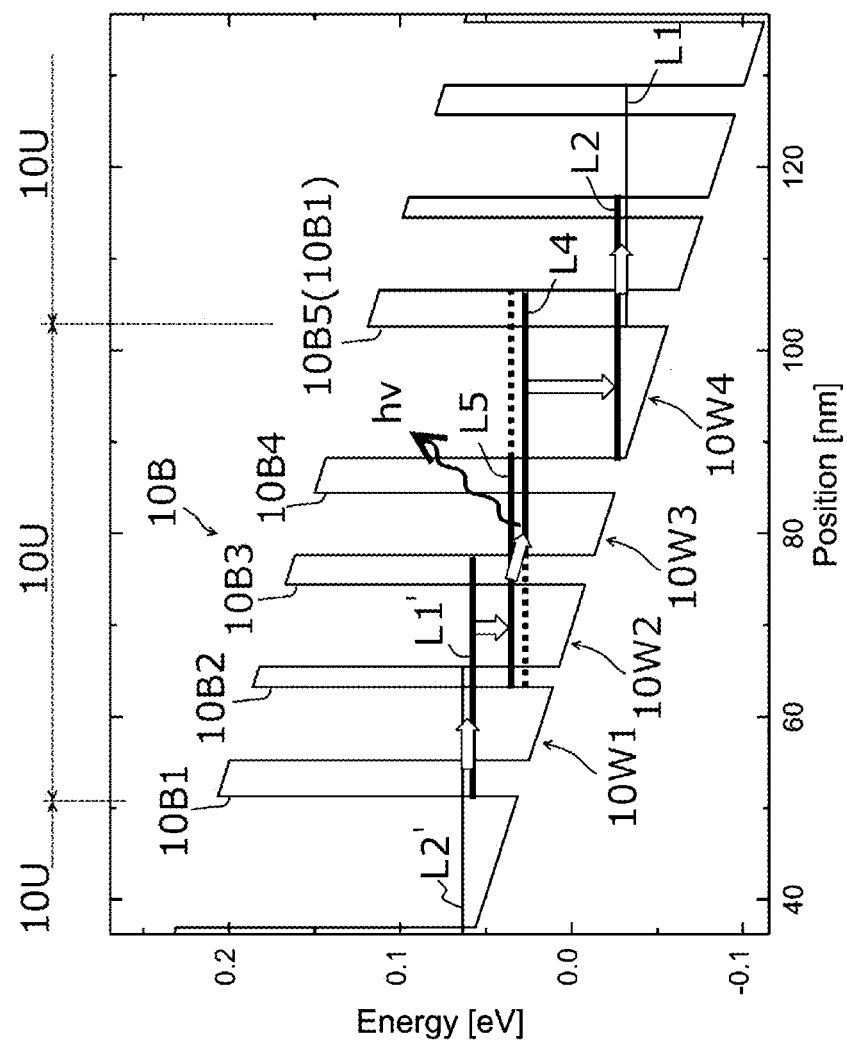
FIG. 4 is a schematic diagram for illustrating transport and transitions mechanisms of electrons in an embodiment of the present invention.

Next, the mechanism of the lasing operation of the THz-QCL element for the embodiment will be described. FIG. 3 is a graph shoving positional dependence of a potential that acts on electrons and distributions of electron's probability of existence calculated by wavefunctions in each level, or each subband, in THz-QCLs in the embodiment. FIG. 4 is a schematic diagram for illustrating transport and transitions mechanisms of electrons in the embodiment. As for the axis in these figures, the horizontal axis denotes z direction in the FIG. 1b, or the thickness direction, while the vertical axis denotes energy values, in units of eV, for the potential on an electron at each position and its energy level. The origin of z direction is appropriately determined in accordance with the necessity of the calculation.

The distribution in FIG. 3 indicates electron's probability of existence in each level in relative values for each position in the z direction, based on wavefunctions $\Psi_1$ to $\Psi_5$ calculated by self-consistent calculation scheme using actually measured thickness values for each layer. The scales of the vertical axis among the levels are kept identical with one another. Four curves are indicated per a unit structure, each of which is distinguished by suffix of 1, 2, 4, or 5. Therefore, values of $|\Psi_1|^2$, $|\Psi_2|^2$, $|\Psi_4|^2$, and $|\Psi_5|^2$, or squared absolute values of wavefunctions, are shown in connection with one of unit structures in FIG. 3. Although other electronic levels may exist, ones that are not related to the embodiment are omitted. For example, a level to be identified by suffix 3 is also included in the calculation and it engages in the transport of electrons only, thus it is not indicated.

All unit structures 10 U that are formed in plurality are made to have an identical layer structure in the present embodiment. The calculation mentioned above reflects the filet that the identical layer structures are included. Levels corresponding curves of $|\Psi_1|^2$, $|\Psi_2|^2$ to $|\Psi_5|^2$, or subbands, are denoted by L1 to L5 respectively. It is to be noted that, the prime (') is used for denoting a level having the same suffix numeral in another unit structure adjacent in a high energy side to one unit structure (in a preceding unit, or smaller z side), and such convention is kept in this specification for easy comparison by following custom. It follows that the prime in the expression of the level L1' should not be construed as specifying that it belongs to the preceding unit. Considering the shape of $|\Psi_1|^2$ in FIG. 3, the level L1' should belong to the unit structure, in a similar way to levels L2-L5.

Also, the graphs show only portions with non-zero values and their vicinity. The differences in the vertical direction among curves are to indicate minimum values E1 to E5 by the positions of baselines for the curves. Although the baselines are not depicted in FIG. 3, they are easily inferred by the lower limits of the curves. The energy values E1 to E5 are minimum energy values because an electron in each level can have the depicted energy values or more due to dispersion relationship of electrons in reciprocal lattice space corresponding to xy directions, or $k_x$-$k_y$ space.

The potentials for electrons are inclined generally as can be seen in FIG. 3. Reference signs for layers within the unit structure 10U in FIG. 1c are also indicated to raised signs and recess portions in the potential.

In the THz-QCL element 1000 in the embodiment, a reception, upper lasing, lower lasing, and depopulation levels correspond to the well layers 10W1 to 10W4, or the first to fourth well layers, respectively. FIG. 3 depicts the reception, the upper lasing, the lower lasing, and the depopulation levels by the curves for levels L1', L5, L4, and L2, respectively. The fact that the levels L1', L5, L4, and L2 correspond to the wells 10W1 to 10W4 respectively can be confirmed by considering the shapes of the curves in FIG. 3. Specifically, the level L1' (reception level) actually has a single peak of amplitude at the well layer 10W1 in spite of the indication of prime, and thus the level L1' should correspond to the well layer 10W1, which is a first well in the unit structure 10U. The level L5 (upper lasing level) has a single peak of amplitude at the well layer 10W2 and has its weighted center around there, thus the level 5 should correspond to the well layer 10W2, rather than to the well layer 10W3. When it comes to the level L4 (lower lasing level), it has a peak at each of the well layers 10W2 and 10W3 and two peaks within the well layer 10W4; the level L4 is concluded to correspond to the well 10W3, based on the comparison of the probabilities of existence among the well layers 10W2, 10W3 and 10W4. Similarly, the level L2, which is a depopulation level, corresponds to the well 10W4. Furthermore, energy values E1', E5, E4, and E2 form a downward shifting energy sequence in this order as can be seen in the baselines of the curves for the levels L1', L5, L4, and L2. Such sequence exits when an appropriate bias electric field is generated during the application of the operation voltage.

The operation of the THz-QCL element 1000 will be described following the sequence of phenomena for the transported electron. FIG. 4 schematically illustrates levels by straight line segments that indicate energy values by the vertical position in the drawing, and the white arrows indicate the transport and transitions of electrons. The thickness of the line segments indicates that the levels are of the unit structure of interest, and the dotted line portions indicate that the probability of existence associated with the portion is small though it is not totally zero. The level L1' that acts as the reception level has an energy value that is quite similar to one for the level L2', which is a depopulation level in the preceding unit structure; the level L1' receives electrons from the level L2' in the preceding unit structure. The easiness of the transport out there is controlled by a thickness of the barrier layer 10B1 and a height of the potential barrier. However, it is not necessary for the electrons to be transported by a resonant tunneling phenomenon.

The four-level type that additionally adopts the level L1' as a reception level, it is possible to inject, electrons with higher efficiency to the level L5 (upper lasing level) even when levels are deformed due to the increase of the operation current or variation of the electric field accompanying the current increase, in contrast to the three-level type. This illustrates that the population inversion can be maintained for a wider range of the operation current. It follows that, decrease of the dynamic range in the current density is avoided for the THz-QCL element 1000 and thus the problem of the carrier stagnation will be prevented.

The arrangement of the levels L5 and L4, which are the upper and lower lasing levels respectively, is such that the level L4 is located below the level L5 with a difference substantially identical to the photon energy of the EM wave to be lased, or for example, ~7.8 meV for 1.9 THz. To realize lasing operation at the low frequency THz region, it is important that the upper and lower lasing levels correspond to different well layers; for example, the level L5 corresponds to the well layer 10W2 as the second well layer and the level L4 corresponds to the well layer 10W3 as the third well layer. That is, the weighted center in the electron's probability of existence in the z direction has a spatial displacement, or a shift, in the positive z direction (right, in FIGS. 3 and 4) from the well layer 10W2 to the well layer 10W3 through the barrier layer 10B3 during the optical transition from the level L5 to the level L4 while losing its energy equivalent to a photon energy of the EM waves. The transition of the electron with such a shift trough a barrier layer is called a diagonal transition.

The design concept in view of the optical transition is as follows. If only an optical transition is concerned, it would be preferable that the overlap integral between the wavefunctions for the levels L5 and L4 is increased to have efficient transitions. It is a direct solution for such purpose to adopt a vertical transition, in which the transition occurs while keeping the weighted center within a single well during the transition. However, it has been revealed for the QCL elements including the THz and mid infrared lasing that electron-electron scattering obstacles the lasing operation between the upper and lower lasing levels, such as the levels L5 and L4 in the present embodiment Additionally, small energy difference for the optical transition in the THz region may hinder adopting the vertical transition, especially in the low frequency region below or equal to 2 THz, the target of the embodiment. The upper and lower lasing levels have an extremely small energy difference therebetween at the low frequency below or equal to 2 THz. Electrons from a level from which the electron is injected (level L1 in the embodiment) to the upper lasing level (level L5) should be transitioned only to the upper lasing level in order to maintain the population inversion, while preventing the direct transition to the lower lasing level (level L4) with bypassing the upper lasing. However, in the low frequency region below or equal to 2 THz, the simultaneous injection, in which electron in the injecting level (level L1') directly transitions to the lower lasing level (level L4) due to LO phonons, is prone to occur due to the small energy difference, and thus the population inversion becomes difficult to maintain.

It is effective to adopt such wavefunctions in the upper and lower lasing levels (or levels L5 and L4 in the embodiment) that the transition of an electron therebetween is made diagonal transition in order to address the problems of electron-electron scattering and the simultaneous injection. The degree of the diagonal transition is determined by the wavefunctions for the upper and lower lasing levels, or levels L5 and L4 in the embodiment. It is to be noted that the concept of the diagonal transition has been introduced in connection with the mid infrared QCL elements for reducing the electron-electron scattering. The inventors of the present application adopt this concept because we consider the diagonal transition should be advantageous in solving the simultaneous injection problem that is unique to the THz-QCL elements.

The quantitative measure as to whether the transition is vertical or diagonal is provided by a value of the overlap integral between the wavefunctions of the levels of interest. The overlap integral of the upper and lower lasing levels becomes small between levels that cause a diagonal transition in comparison to ones that cause a vertical transition, resulting in the small oscillator strength and weak optical transition. Therefore, in addition to the easiness for maintaining the population inversion, degree of the optical transition is also taken into account when determining the deprive of diagonal transition.

In consideration of the injection operation of electrons from the reception level (level L1') to the upper lasing level (level L5), two viewpoints are taken into account in designing the wavefunctions for the diagonal transition. One is that, the position of high probability of existence of an electron in the level L4 is made remote from the position of high probability of existence in the level L5, when viewed from a position where the electron's probability of existence of the level L1'. This is because electrons are transported and transitioned with a cascade manner in a unidirectional way. The other is that, the overlap integral of the wavefunctions between the levels L5 and L4 is made small while the photo luminescence is not overly suppressed. Specifically, if the overlap integral:

$$\int \Psi_5^* \Psi_4 dz \qquad \text{[Formula 1]}$$

is made small, the degree of diagonal transition is increased. In this regard $\Psi_5$ and $\Psi_4$ are z dependent factors of normalized wavefunctions of an electron for levels L5 and L4, and the asterisk affixed to the upper right indicates the complex conjugate. The layer structure and the first bias electric field are determined such that the wavefunctions becomes appropriate in view of the diagonal transition, based on the value of dipole moment calculated from the wavefunctions in the upper and lower lasing levels (levels L5 and L4) and the value of the overlap integral mentioned above. As a result of such a design, weighted centers of electron's probability of existence in the levels L1', L5 and L4 correspond, in a qualitative meaning, to the well layers 10W1, 10W2, and 10W3, respectively, as depicted in FIG. 3. The weighted center of electron moves during the optical transition from the level L5 to the level L4 as if it goes through the barrier layer 10B3, as indicated by a white arrow in FIG. 4. Selective injection can be achieved if the wavefunctions are designed to have appropriate degree of diagonal transition. This scheme solves the problem of difficulty common to THz-QCL elements in keeping the population invention, and the problem of simultaneous injection is also alleviated or removed. As a result, the appropriate lasing operation is realized with maintaining the population invention in the THz-QCL elements We confirmed that the diagonal transition actually leads to the selective injection in the embodiment. The selective injection can be directly estimated by relative comparison of two overlap integrals: an overlap integral $f_{1',5}$ between levels L1' and L5, and an overlap integral $f_{1',4}$ between levels L1' and L4. The overlap integrals $f_{1',5}$ and $f_{1',4}$ are calculated as follows:

$$f_{1',5} = \int \Psi_{1'}^* \Psi_5 dz \qquad \text{[Formula 2]}$$

$$f_{1',4} = \int \Psi_{1'}^* \Psi_4 dz,$$

thus, a ratio $f_{1',5}/f_{1',4}$ can be a measure for the degree of selective injection. The values for the measure are provided in Table 2. For the purpose of comparison, ratio values are calculated also for typical designs of vertical transition and small degree of diagonal transition (large overlap integral value in the Formula 1). Scattering time constants of electrons between levels ($\tau_{1',5}$ and $\tau_{1',4}$, in picoseconds) are also provided as measures of the probability of transition of electrons from the level L1' to level L5 or L4.

TABLE 2

|  | $f_{1',5}/f_{1',4}$ | $\tau_{1',5}$ (ps) | $\tau_{1',4}$ (ps) |
| --- | --- | --- | --- |
| Vertical transition | 1.1 | 0.6 | 0.8 |
| Small diagonal transition (Large overlap integral in Formula 1) | 3.2 | 0.7 | 2.3 |
| Large diagonal transition (Small overlap integral in Formula 1) | 5.7 | 0.7 | 4.0 |

As provided in the Table 2, a case in the present embodiment that adopts small overlap integral of Formula 1, i.e., large degree of diagonal transition, has large ratio $f_{1',5}/f_{1',4}$ and may have higher efficiency for the transition from the reception level (level L1') to the upper lasing level (level L5) in comparison with transition to the lower lasing level (level L4). As for the time constant for transitions of electrons scattering from the reception level (level L1'), the present embodiment realizes notably large transition probability in the transition to the upper lasing level (level L5) than to the lower lasing level (level L4). In this way, the selective transition to the upper lasing level can be achieved by decreasing value of the overlap integral in Formula 1, or increasing the degree of diagonal transition.

The operation after the lower lasing level (level L4) is as follows. The electrons are depopulated by way of the scattering by the LO phonon from the level L4 into the depopulation level or the level L2 that has an energy value lower than the level L4 by the second energy difference. The second energy difference is determined independently from the first energy difference. Specifically, the second energy difference has been determined to have high relaxation rate such that scattering of electron by the LO phonon helps the maintenance of the population inversion between the levels L5 and L4. Typical value for the second energy difference is the same as or larger than the energy of the LO phonon in the crystal lattice in the active region.

The electron depopulated by the level L2 is then received by a reception level (level L1) in the following unit structure, or a downstream unit structure. The barrier 10B5 is identical to a barrier 10B1 for the following unit structure.

The transport and transitions of electrons in each unit structure are the same as described above. After the optical transition in the unit structure, the electrons further act the optical transitions also in the following unit structure, resulting in the recycling of the carriers. Moreover, if an appropriate cavity structure is adopted to confine the EM waves, coherent EM waves in the region of THz region are output by way of the lights of the stimulated emission.

Working Examples

Next, working examples for the embodiment will be described based on the actually fabricated element of the THz-QCL element 1000. In the description of the working example, details including type of materials, use amount of materials, or ratios among them, processing details, processing orders, and specific arrangement of elements or parts, are provided; however, they may be changed as necessity, so long as the concept of the present invention is unchanged. Therefore, the scope of the present invention is not limited specifically to the description set forth below.

Figure 5:
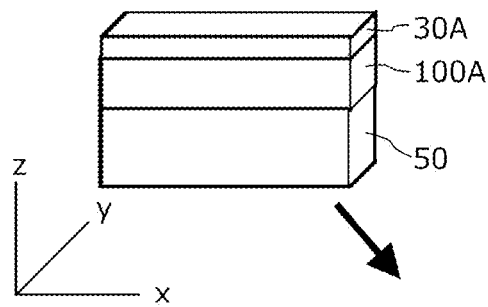
FIG. 5 is a schematic diagram of element structures at each step through fabrication of a THz-QCL element in an embodiment of the present invention.
Figure 5:
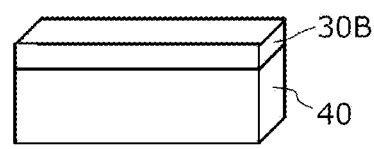
Figure 5:
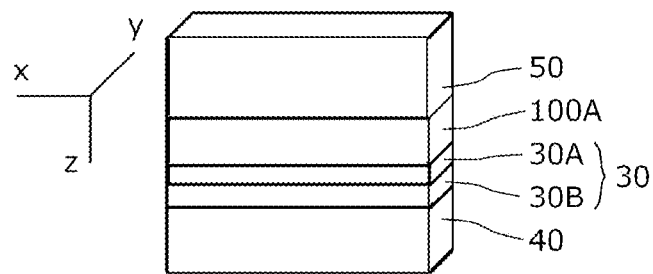
Figure 5:
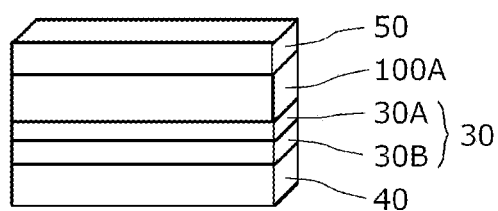
Figure 5:
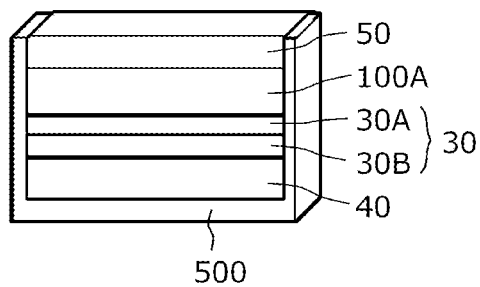
Figure 6:
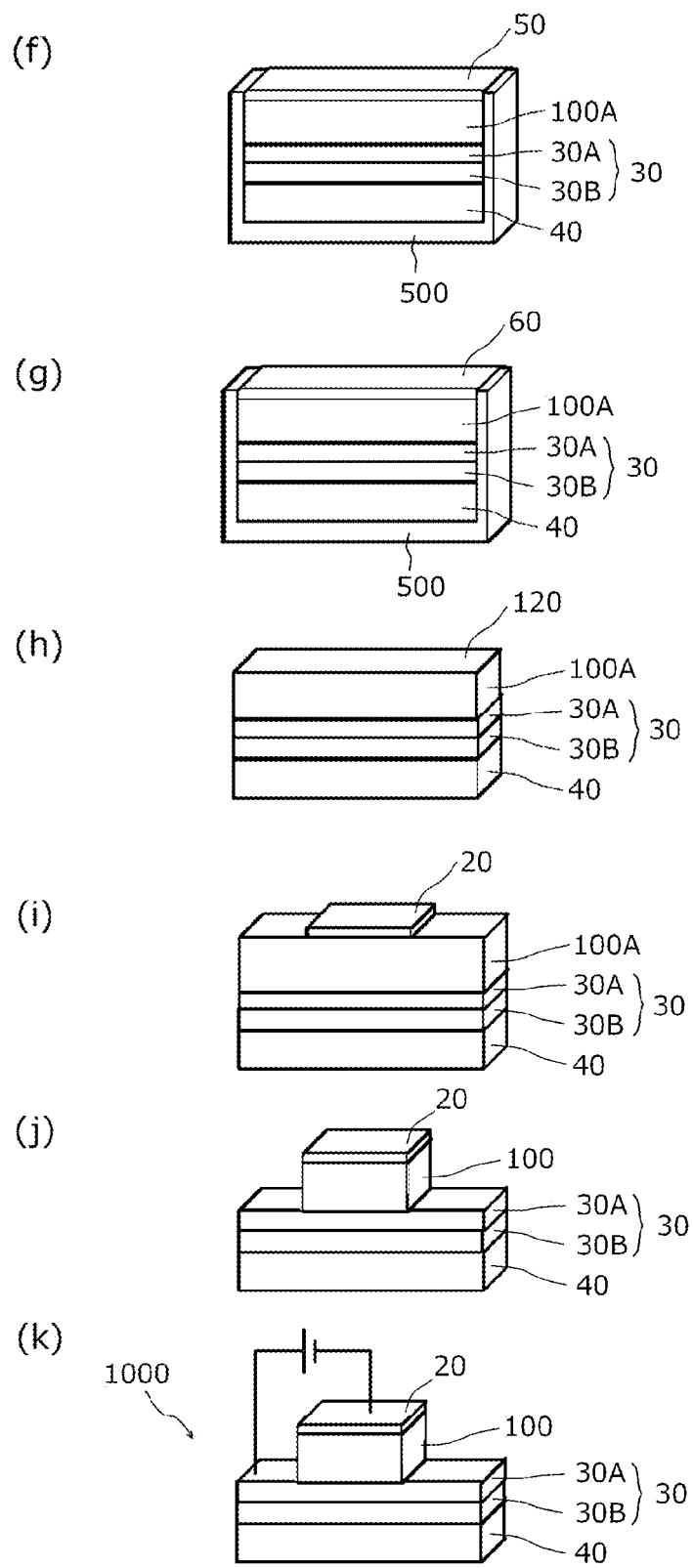
FIG. 6 is a schematic diagram of element structures at each step through fabrication of a THz-QCL element in an embodiment of the present invention.

FIGS. 5 and 6 are schematic diagrams of element structures at each step through fabrication of a THz-QCL element in the present embodiment First of all, the SSL 100A in FIG. 1 was formed by epitaxial growths on surfaces of each step. This process initiated by adopting a semi-insulating, single crystal GaAs of (100) surface orientation as the substrate 50. The ES layer 60 (FIG. 1b) was formed thereon. The ES layer 60 was a 250 nm thick $Al_{0.6}Ga_{0.4}As$ layer deposited as an etching resistive material against etchant in an etching process of the substrate 50 to be performed later. The highly doped GaAs layer 120 was then formed to have a contact layer. The electronic density of the layer was made ~$3 \times 10^{18}$ cm$^{-3}$ by doping. Next, the active layer 10 was formed. Regarding the active layer 10, $Al_{0.175}Ga_{0.825}As$ was adopted for the barrier layers 10B and GaAs was adopted for the well layers 10W. The thickness for each layer was determined to realize the design provided in Table 1. The number of stack repetition for the unit structures 10U was 185. The actual thickness values were ones in the working example column in Table 1. These actual thickness values were obtained from satellite peak angles in the X ray diffractometer (XRD) measurement for the SSL. The total thickness in the bottom line of the Table 1 was a summed up thickness over the layers in one unit structure.

Figure 7:
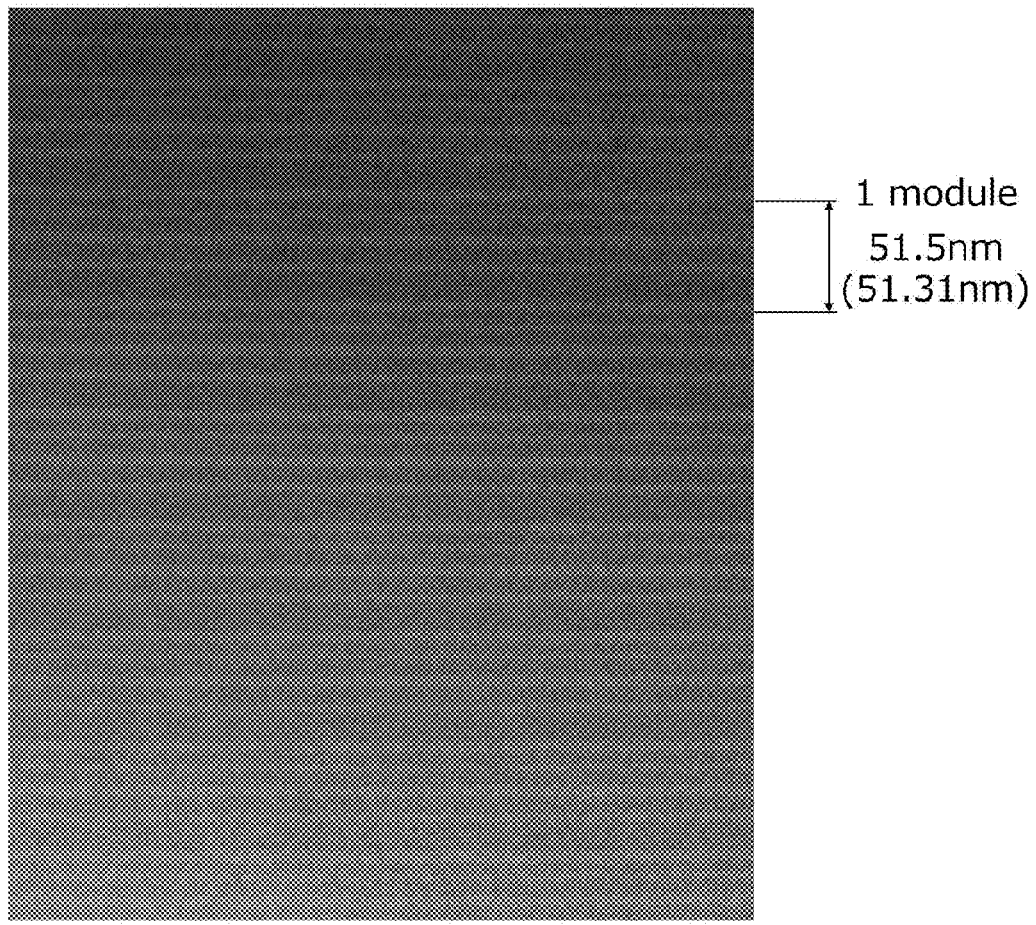
FIG. 7 is an example TEM cross-section micrograph of crystal lattice in unit structures for an element similar to the THz-QCL element of the present invention.

FIG. 7 is an example TEM cross-section micrograph of crystal lattice in unit structures for an element similar to the THz-QCL elements of the working example. The repeats of unit structures of epitaxial growth, each of which has sharp hetero interfaces with controlled thickness to the atomic layer preciseness, as found in the micrograph image was observed in the present working example too. We confirmed, through the measurement of the thickness in the XRD and the image of the TEM micrographs as mentioned above, that the MBE crystal growth for the THz-QCL element in the working example was carried out successfully with the preciseness to a single atomic layer level, making maximum use of the MBE technique. The thickness fabrication errors in the layers were 1% or less in comparison with the designed thickness, as provided in Table 1.

Referring back to FIG. 5a, the 50 nm thick highly doped GaAs layer 140 was then formed as a part of the SSL 100A (FIG. 1a). The highly doped GaAs layer 140 was made with controlled electronic density of ~$3 \times 10^{18}$ cm$^{-3}$. Then the delta-dope GaAs layer 160 as a contact layer was formed. The delta-dope GaAs layer 160 was a layer consisting of ten sets of 1 nm thick GaAs layer and delta-dope layer of Si. Then 5 nm thick low temperature growth GaAs layer (LTG GaAs layer) 180 was formed. Thereafter, a metal layer 30A was formed as in FIG. 5a. The metal layer 30A had a structure of Ti (5 nm)/Ta (20 nm)/Cu (600 mu)/Au (100 nm), in "material (thickness)" notation in the order of deposition.

In addition, the receptor 40 of GaAs was prepared with the metal layer 30B deposited thereon. The metal layer 30B was formed to have the same structure as the metal layer 30 on the receptor 40.

Next, the metal layers 30A and 30B were bonded to make an almost integrated structure with wafer bonding, in which the metal layers were pressed each other with heat treatment to form an electrode 30, The typical conditions for this process are 320 degree C. 30 minutes pressurization with nitrogen atmosphere while keeping a pressure of 50 kgf/cm$^2$ (~4.9 MPa) through the entire process.

Thereafter, the substrate 50 and the receptor 40 were polished to have 80 μm and 20 μm thickness respectively as in FIG. 5d, and then they were coated by wax 500 over the surface area except the outer surface of the substrate 50, as indicated in FIG. 5e. It is to be noted that the wax 500 is not depicted in FIG. 5e for the explanation purposes.

Next, most part of the substrate 50 was removed by wet etching process as in FIG. 6f. The wet etching was carried out with etchant of $H_3PO_4:H_2O_2$=1:1:1 (in volume ratio), liquid temperature 10 degree C. for ~10 min. The selective etching was carried out. The etchant was citric acid ($C_6H_8O_7:H_2$): $H_2O_2$=3:1 (in volume ratios) with 40 degree C. liquid temperature for 1 to 3 hours. As a result, the ES layer 60 was exposed to the surface by removing the substrate 50 as can be seen in FIG. 6g. Thereafter the selective etching was carried out to remove the ES layer 60 by buffered fluorinated acid (HF with $NH_4F$). At this stage, the ES layer 60 was removed, and the highly doped GaAs layer was exposed to the surf-ice of the SSL 100A.

Next, the electrode 20 was formed on the surf-ice of the highly doped GaAs layer 120 in the SSL 100A (FIG. 6i). The electrode 20 had a layered structure of Ti (5 nm)/Ta (20 nm)/Cu (600 nm)/Au (100 nm) from the surface of the highly doped GaAs layer 120, and was patterned to have a width of 200 μm. Then dry etching was carried out with chlorine gas while using the electrode 20 as an etching mask for removing the periphery portion of the SSL 100A. Thus the QCL structure 100 was formed with a mesa width of 200 μm and a cavity length of 0.5 to 1.5 mm by cleaving (FIG. 6j). Lastly, electrical connections are established to the electrodes 20 and 30, and thus the manufacturing of the operable THz-QCL element 1000 was completed (FIG. 6k).

Figure 8:
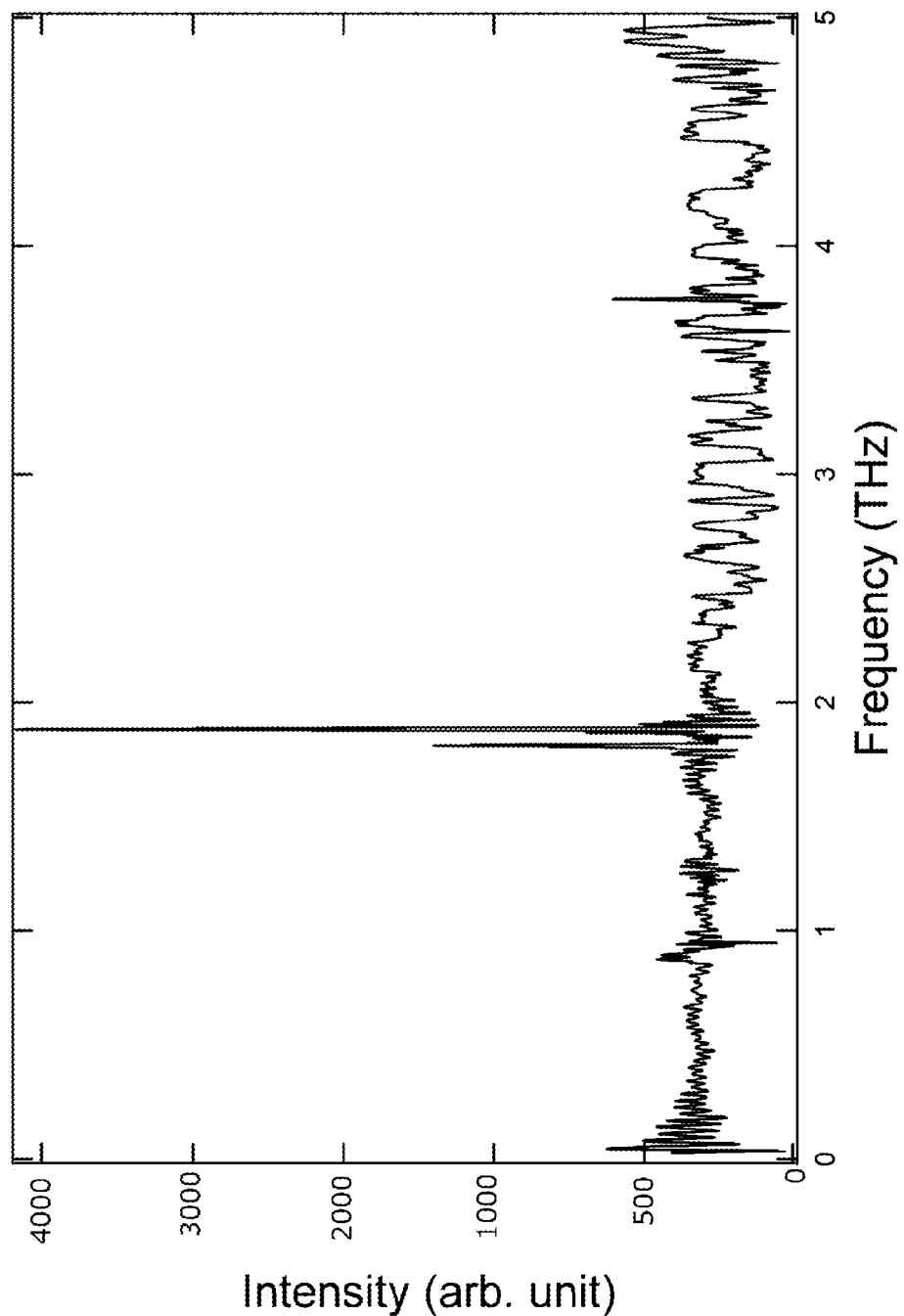
FIG. 8 is a graph showing a frequency spectrum of EM waves emitted from an example THz-QCL element of the present invention.
Figure 9:
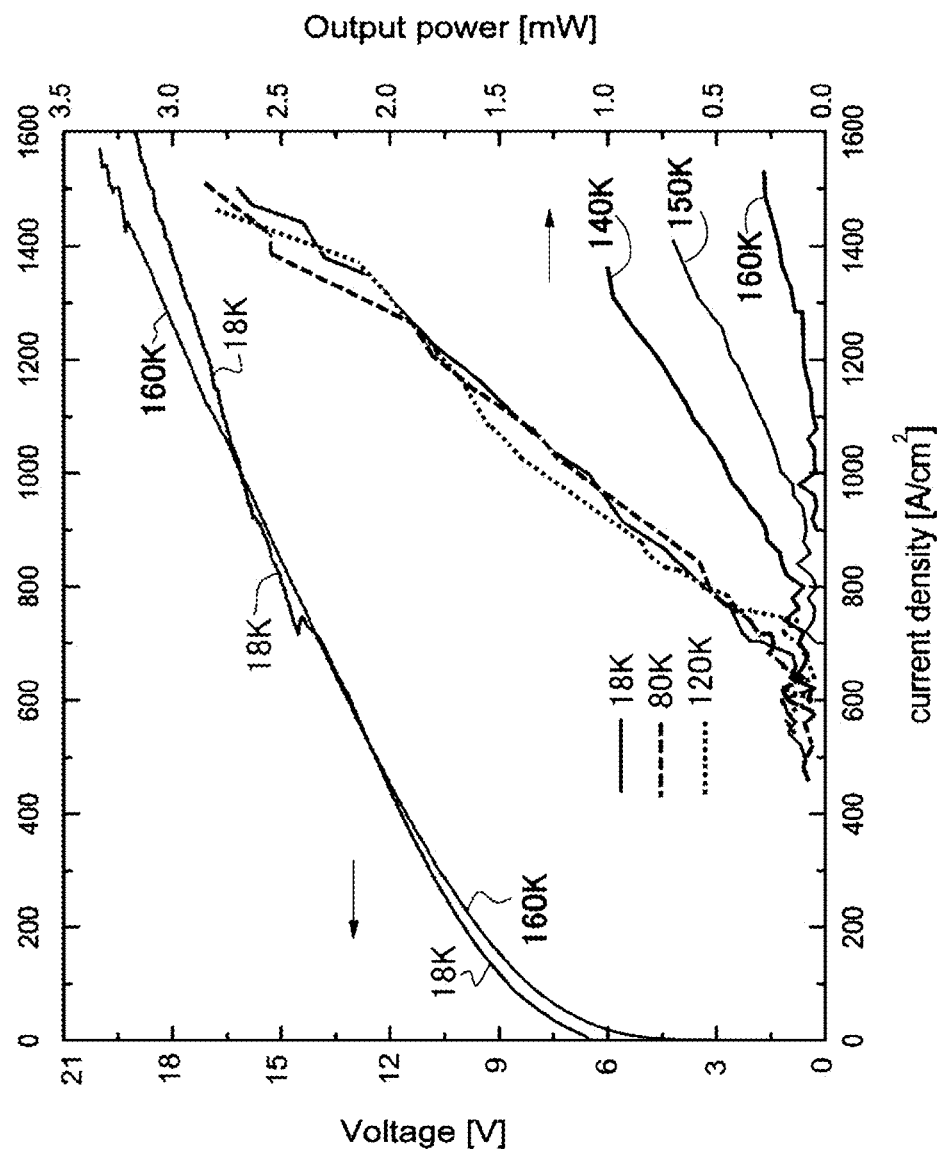
FIG. 9 is a graph showing electric current-light intensity characteristics and electric current-voltage characteristics, both obtained from an example THz-QCL element of the present invention.

We observed pulse lasing operations at various temperatures in the low frequency THz range for 1 kHz repetition frequency and 200 nsec pulse duration with the manufactured example of the THz-QCL element 1000. The operations were observed as follows. FIG. 8 is a graph showing a frequency spectrum of ENI waves emitted from the example THz-QCL element. FIG. 9 is a graph showing electric current-light intensity characteristics and electric current-voltage characteristics, both obtained from the example THz-QCL element. FIG. 8 shows a measurement result of the emission spectrum with FTIR (Fourier-Transform Infrared Spectroscopy) apparatus capable of obtaining spectrum in the THz range, or THz-FTIR with cooled THz-QCL element 1000 to 16 K. In the measurement range of ~0 to 5 THz, 1.89 THz lasing was observed with a narrow spectral width below the measurement limit. It should be noted that lasing operation at a frequency slightly lower than 1.89 THz was also observed for the element. Since we should expect that the lasing operation should accompany longitudinal mode emission, we do not consider this lasing operation to be substantially different one from the 1.89 THz lasing. As stated above, a single frequency lasing operation was observed at 1.89 THz, while lasing operations in other frequency range were suppressed in the working example. It should also be noted that, although there is a slight frequency difference between the observed lasing of 1.89 THz and our target frequency, the first frequency of 1.9 THz, we believe it is insignificant one.

As indicated in FIG. 9, we measured the electric current-light intensity characteristics while changing the temperature (heat-sink temperature) of the THz-QCL element 1000. The electric current-light intensity characteristics is shown by the output intensities of 1.89 THz single frequency EM waves (in the right vertical axis) for electric current densities (in the horizontal axis). The electric current-voltage characteristics are indicated for the lowest temperature (18 K) and the highest temperature (160 K) with the lasing operation in the measurement, with the current density in the horizontal axis and the voltage in the left, vertical axis.

The electric current-light intensity characteristics for different temperatures were similar over a lower temperature range between ~18 K and ~120 K. In the range of ~120 K to ~130 K the threshold current density Jth began to increase and the light intensity became decrease. The temperature at which the threshold current density Jth began to increase was 10 to 20 K higher than that in Non-Patent document 1. We have observed the highest operation temperature for the working example to be 160 K. On the other hand, there was a kink at around a current density of 750 A/cm$^2$ at 18 K operation in the electric current-voltage characteristics. The light intensity was observed to increase in the electric current-light intensity characteristics over the 750 A/cm$^2$, which was unclear thereunder. In view of the spectrum in FIG. 8, the lasing operation began at around 750 A/cm$^2$ where the kink was found, and we can conclude that no lasing operation occurred at the other frequency than 1.89 THz.

It is to be noted that the light intensities below the kink are not totally vanished at 18 K operation in FIG. 9. This is caused by noise in the measurement. Weak light intensity values may be overlap with such noise in the other temperature measurements; however, strong light intensities of the lasing operations of 1.89 THz were found at any temperatures.

Figure 10:
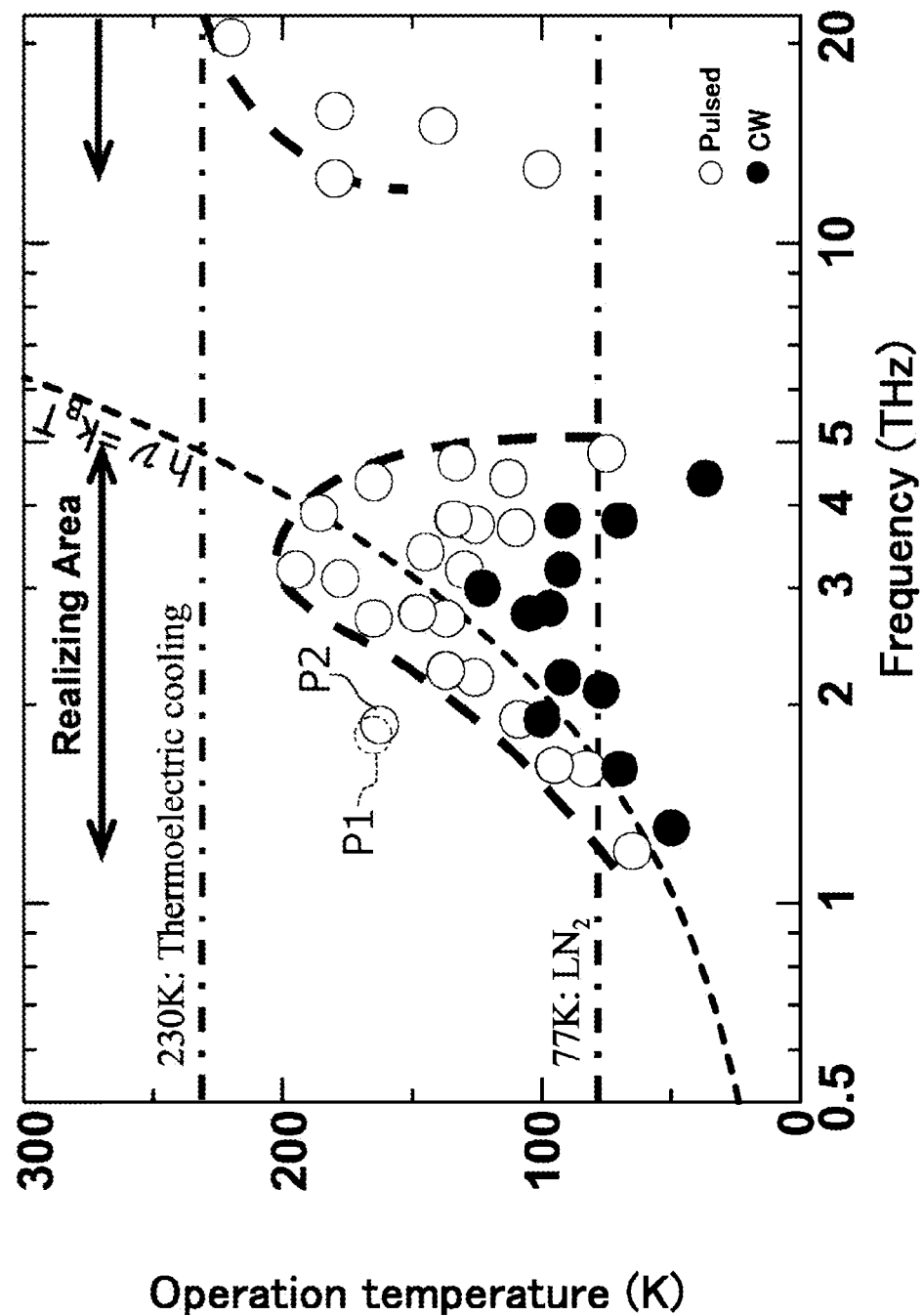
FIG. 10 is a graph on which the operation temperature is plotted at the frequency for the example THz-QCL element of the present invention in addition to ones reported for the conventional THz-QCL elements.

FIG. 10 is a graph on which the operation temperature is plotted at the frequency for the example THz-QCL element of the embodiment, in addition to ones reported for the conventional THz-QCL elements. The point P2 shows the operation temperature of THz-QCL element 1000 of the present embodiment. The point P2 substantially overlaps the point P1, which indicates the operation temperature at lower frequency of the THz-QCL element with dual frequency lasing reported in Non-Patent document 1. Importantly, unlike the element in Non-Patent Document 1, we have never observed dual frequency operation at any temperature range for the THz-QCL element 1000 manufactured as the working example in the embodiment.

Mechanisms in the THz-QCL Element of the Embodiment

In consideration of the foregoing result for the working example, we describe actual mechanism for the operation of the THz-QCL element 1000 in the embodiment, especially the reason why the operation temperature with the target frequency operation was raised, as well as the reason why the dual frequency operation was suppressed unlike one in Non-Patent Document 1.

Mechanism of the Raised Operational Temperature

Figure 11:
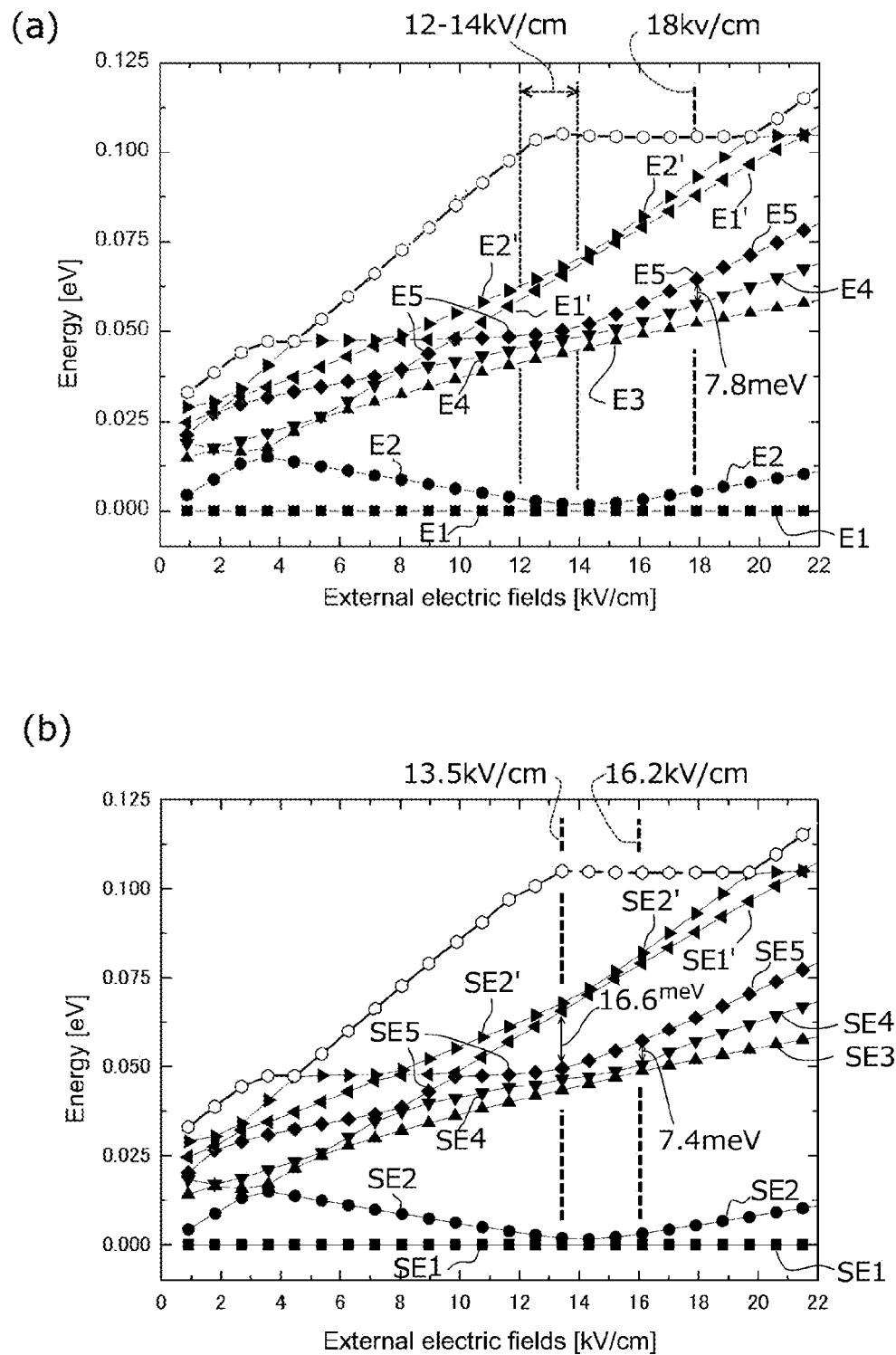
FIG. 11 illustrates graphs showing calculated energy values of each levels in THz-QCL elements for a range of bias electric field, for an embodiment of the present invention (FIG. 11a) and the THz-QCL element reported in Non-Patent Document 1 (FIG. 11b).

FIG. 11 illustrates graphs showing calculated energy values of the levels in THz-QCL elements for a range of bias electric field, for the embodiment (FIG. 11(a)) and the THz-QCL element reported in Non-Patent Document 1 (FIG. 11(b)). The graphs in FIG. 11 show energy values obtained through self-consistent calculation with a parameter of the bias electric field, for the actual structure (material and thickness) of the example THz-QCL element 1000 (FIG. 11a) and the reported structure in Non-Patent document 1 (FIG. 11*b*). The bias electric field in the horizontal axis has been changed with a step of 0.9 kV/cm. Note that the bias electric field can be adjusted by a direct current voltage applied between a pair of electrodes 20 and 30 for the THz-QCL element 1000 in the embodiment. Energy values indicated by outlined white marks are those that are not related to the operation. In addition, the values for the embodiment (FIG. 11*a*) are indicated in reference signs of E1 to E5, whereas ones for Non-Patent Document 1 are indicated by SE1 to SE5 (FIG. 11*b*).

We suppose that a bias electric field corresponding to ~18 kV/cm in FIG. 11*a* should be actually applied inside of the working example of the THz-QCL element in the embodiment. This is because the photon energy (~7.8 meV) for 1.9 THz, the target value, or 1.89 THz, the actual value, corresponds to the energy difference between the upper lasing and lower lasing levels, E5-E4, for a bias electric field of 18 kV/cm. Based on the similar estimation, we suppose that a bias electric field of ~16.2 kV/cm corresponding to the actual lasing frequency of 1.8 THz (7.4 meV) should be actually applied inside of the THz-QCL element reported in Non-Patent document 1 as indicated in FIG. 11*b*.

The structure of levels including the upper and lower lasing levels at each bias voltage is explained as follows. The transition of an electron from the level L1' (reception level) to the level L5 (upper lasing level) is related to scattering with LO phonons. Because of such a nature, the first energy, which is an energy difference between the levels L1' and L5, is selected in association with the LO phonon energy value. When GaAs is selected for the well layer and a material of composition between $Al_{0.15}Ga_{0.85}As$ to $Al_{0.2}Ga_{0.8}As$ is selected only for the barriers between the wells, energy values for the LO phonon quanta in the active region of the crystal lattice is not changed substantially. Actually, the LO phonon energy for a combination of GaAs well layer and $Al_{0.15}Ga_{0.85}As$ barrier layer (the case for Non-Patent Document 1) is ~36.5 meV, whereas one for a combination of GaAs well layer and $Al_{0.175}Ga_{0.825}As$ barrier layer (the case for the embodiment) is ~36.8 meV. The inventors have found through our research that higher temperature operation is possible if the LO phonon energy not only in the barrier layers but in well layers is increased. However, since the energy values are substantially the same, we do not believe that the energy value of the LO phonon energy has significant impact on the operation temperature in the present embodiment.

The design guidelines for efficiently causing electron transition to the level L5 while preventing carrier stagnation in the level L1 is clear. Specifically, it is preferable that the energy difference between the levels L1' and L5, or the first energy difference is more than 21 meV, and it is more preferable that it is 25 meV or more. This is because thermal excitation of electrons is also related to the transition of electron from the level L1' to the level L5 through the LO phonon scattering. The electron at the level L1' is able to have higher energy due to thermal excitation within the level L1'. It should be noted that the energy value E1' depicted as the baseline of the level L1' is a value at $k_x=k_y=0$ of a parabolic curve shape in the reciprocal space for x y directions, or $k_x-k_y$ space. Of electrons in the level L1', ones that have reached an energy level higher than the level ES by the amount of the LO phonon energy can be relaxed with high rate to the level ES with displacement in the $k_x-k_y$ space. According to the mechanism that is related to both of the thermal excitation and the LO phonons, it is possible to estimate the lower limit of the temperature over which the relaxation may be expected. Specifically, in the case of Non-Patent document 1, the LO phonon energy (36.5 meV) differs from the first energy (21.5 meV) by 15.5 meV. This difference of 15.5 meV corresponds to temperature of ~170 K to have thermal excitation. In contrast, in the case of the present embodiment, the LO phonon energy (36.8 meV) differs from the first energy (25 meV) by 11.1 meV, which corresponds to 124 K in terms of temperature. That is, in the working example in the embodiment the high rate injection mechanism begins at 46 K lower temperature than the case of Non-Patent Document 1. More particularly in Non-Patent Document 1, the relaxation by the LO phonon can take place only when the temperature is substantially the same as the operation temperature (163 K) or above. Conversely, if the difference in values for the LO phonon energy and the first energy exceeds the value in Non-Patent Document 1, that is, if the difference in the levels L1' and L5 (the first energy difference) is set larger than 21 meV, then the higher rate relaxation by the LO phonon actually works in the injection of electrons into the level L5. Moreover, it is preferable to set the first energy difference as large as 25 meV like in the working example, because the high rate relaxation by the LO phonons helps generating or sustaining the population inversion at a temperature of 124 K or higher. It is more preferable to set the first energy difference to the value of the LO phonon energy or more to take advantage of effects of relaxation by the LO phonons without expecting thermal excitation in further ideal situation. These preferable numerical ranges for the first energy difference values are equally applicable to other material compositions having similar LO phonon energy values.

It should be noted that Non-Patent Document 1 explains as if LO phonons were relevant to electronic transition from the level L1' to the level L5. However, the inventors of the present application believe that scattering by LO phonons is actually irrelevant to the electronic transition in the case of Non-Patent Document 1, because thermal excitations are impossible for the energy difference and the temperature therein. Electron-electron scattering should act on the electronic transition from the level L1' to the level L5 in Non-Patent Document 1, rather than the LO phonon scattering. The transition by the electron-electron scattering has a property in which the transition probability increases when electrons have similar energy values with one another: the difference around 20 meV between the levels L1' and L5 in Non-Patent Document 1 may be such that it helps generate population inversion, though it is relatively disadvantageous than ones with smaller energy difference.

Mechanism of Suppressing Dual Frequency Lasing

Net described is the suppression mechanism of lasing at a different frequency from the first frequency with weaker electric field than the first bias electric field in the embodiment, in comparison with Non-Patent Document 1.

Figure 12:
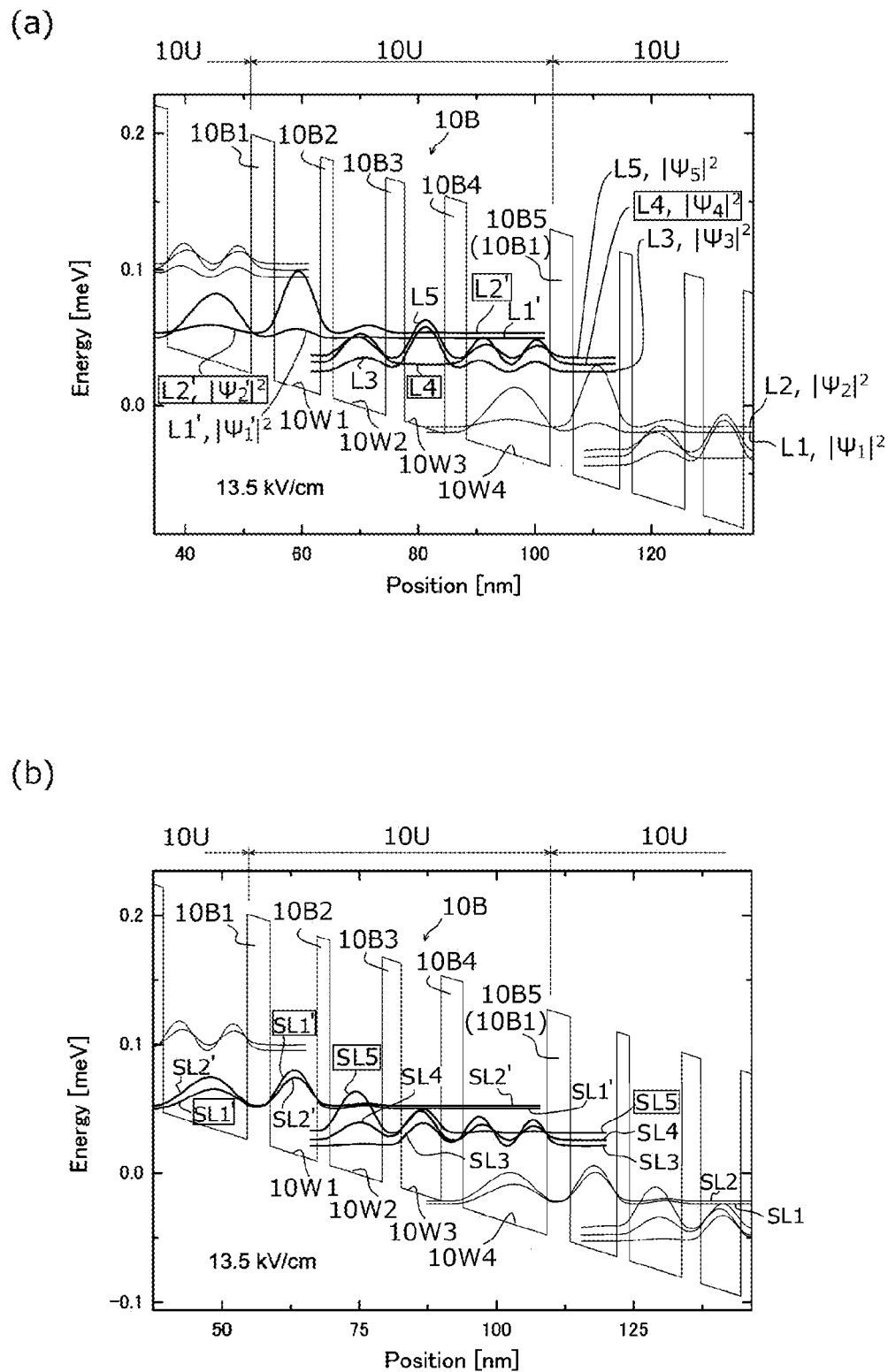
FIG. 12 illustrates graphs of distributions for electron's probability of existence calculated from wavefunctions of an electron in each level, or each subband at a weak bias electric field (second bias electric field), corresponding to an embodiment of the present invention (FIG. 12a) and the THz-QCL reported in the Non-Patent Document 1 (FIG. 12b).

FIG. 12 illustrates graphs of distributions for electron's probability of existence calculated from wavefunctions of an electron in each level, or each subband, at a weak bias electric field (second bias electric field). FIG. 12*a* depicts the working example for the present embodiment and reference signs L1 to L5 are provided for the levels, whereas FIG. 12*b* depicts a structure in Non-Patent Document 1 and reference signs of SL1 to SL5 are provided for the levels.

One of the reasons for the lasing operation at an unnecessary frequency in Non-Patent Document 1 (4 THz) is that a difference between the energy values SE1' and SE5 for a bias electric field around 115 kV/cm is 16.6 meV as indicated in FIG. 11*b*, which corresponds to 4 THz. However, such an energy difference by itself would not give sufficient explanation for the facts: lasing operation at the unnecessary frequency in Non-Patent Document 1 and suppression of lasing at such unnecessary frequency in the present embodiment.

Actually, there may be levels having energy difference corresponding 4 THz or the like in the embodiment, as depicted in FIG. 11a. The difference between energy values E1 and E5 in a range of 12-14 of the bias electric field in the embodiment may be around 16.6 me as can be seen in FIG. 11a.

Therefore, the inventors of the present application have investigated as to why the lasing at the unnecessary frequency occurred or suppressed. Then we have come to hold a working hypothesis that may explain the mechanism as to why the dual frequency lasing has been suppressed by taking the electron's probability of existence based on wavefunctions for each level at a bias electric field of 13.5 kV/cm into account. FIG. 12h illustrates, in a similar fashion to FIG. 3, the electron's probability of existence under a bias electric field of 13.5 kV/cm, with which the lasing with the unnecessary frequency seems to be induced in Non-Patent Document 1. We suppose that the lasing operation at the unnecessary frequency would be generated between the levels SL1' and SL5, which act the upper lasing and lower lasing levels respectively. This is because the levels SL1' and SL5 are corresponding to the well layers 10W1 and 10W2 respectively, and they are located near with each other; thus, through a qualitative discussion the levels SL1' and SL5 are considered to be a pair of levels that are prone to cause optical transition. Please note that, to make the explanation consistent, we use the same set of reference signs for Non-Patent Document 1 and the embodiment for the well and barrier layers. Also, we added reference signs enclosing marks for levels that seem to act as the upper and lower lasing levels for a unit structure.

FIG. 12a illustrates the structure of levels for the electric field of 13.5 kV/cm in the present embodiment, which has a relationship similar to the above. The levels L2 and L4 may act as the upper and lower lasing levels if lasing at the unnecessary frequency is induced. This attribution is made because the levels L2' and L4 correspond to the well layers 10W1 and 10W2 respectively, and the levels L2' and L4 are prone to cause optical transition. FIGS. 3 and 12a are calculated based on the same conditions except the bias electric field. It should be noted that the reference signs are given in the order of their energy values. Since the inclination of potentials is smaller due to weak bias electric field in FIG. 12.a than in FIG. 3, a level corresponding to well 10W1 is denoted as level L1' in FIG. 3 but as level L2' in FIG. 12a. This is because the levels L2' and L1' degenerate with each other around a bias electric field of 14 kV/cm as in FIG. 11a, and the reference signs of levels L2' and L1' are exchanged with each other between each side of the bias electric field of the degeneration.

In the following discussion, we call upper and lower levels for lasing operation at an unnecessary frequency as an "unnecessary upper lasing level" and an "unnecessary lower lasing level" respectively, to consistently explain the underlying mechanism without affected by the reference signs convention. If we are to give definitions to such levels without loss of generality, the unnecessary upper lasing level is either level of a reception level of the unit structure and a depopulation level in the previous unit structure, that has high probability of existence in the first well layer (well layer 10W1) under the second bias electric field. Likewise, the definition to the unnecessary lower lasing level is defined without loss of generality as either level of an upper lasing level and a lower lasing level, both in the unit structure, that has high probability of existence in the second well layer (well layer 10W2) under the second bias electric field. Please note that, although the second bias electric field is denoting an electric field that induces a problem of lasing at an unnecessary frequency, it should mean any electric field weaker than the first bias electric field without limitation. In addition, the unnecessary upper and lower lasing levels are separated by an energy difference corresponding to a photon energy of a different frequency from the first frequency, or the target frequency. In the following explanation, these terms are used with the help of notations of the levels in the figures as necessity.

Figure 13:
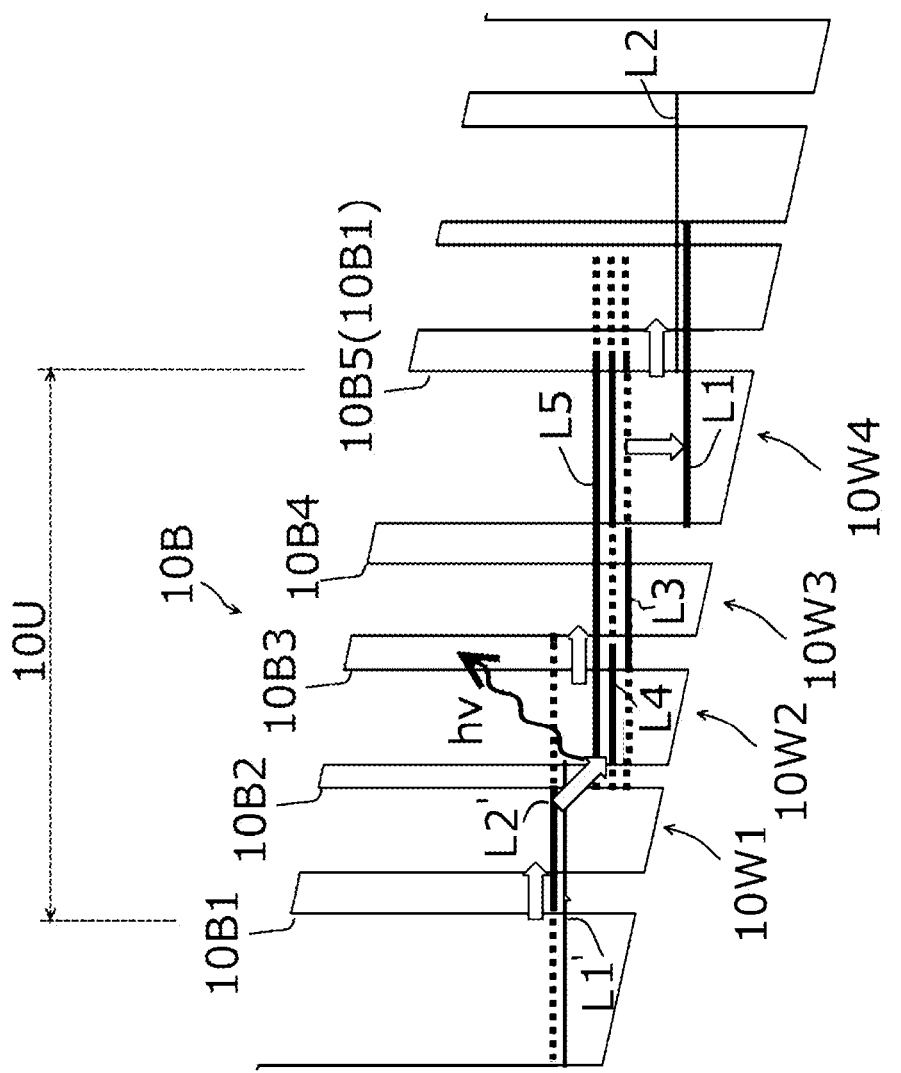
FIG. 13 is a schematic diagram for illustrating a mechanism for transport and transitions for electrons at a weak bias electric, field.

With the aim of providing the validation to the working hypothesis mentioned above, the inventors of the present application have focused upon the numerical relationship between the unnecessary upper and lower lasing levels. Since the unnecessary upper and lower lasing levels correspond to the first and second well layers respectively, the probability of existence determined by wavefunctions have significant values in the first and second well layers. We consider it important to clarify the relationship between the unnecessary upper and lower lasing levels, so long as transitions between them are concerned. And we have calculated overlap integrals between wavefunctions for the unnecessary upper and lower lasing levels, for levels L2' and L4 in FIG. 12a, and for levels SL1' and SL5 in FIG. 12b, to obtain their values as 0.12 and 0.16 in this order. Please note that the overlap integral is given by $$\int \Psi_U^* \Psi_L dz, \qquad \text{[Formula 3]}$$

where $\Psi_U$ and $\Psi_L$ are dependent factors of normalized wavefunctions of the unnecessary upper and lower lasing levels respectively. The smaller the overlap integral is, the larger the degree of diagonal transition becomes, as explained in the diagonal transition between the upper and lower lasing levels. However, unlike the diagonal transition described in connection with the upper and lower lasing levels, the transition concerned here is a diagonal transition between the first well layer (well layer 10W1) to the second well layer (well layer 10W2) through the barrier layer 10B2 therebetween. FIG. 13 schematically illustrates the mechanisms of transfer and transitions of an electron with weak bias electric field. Although FIG. 13 indicate the probability of existence of electron schematically in levels that are indicated in connection with the present embodiment in FIG. 12a, Non-Patent Document 1 in FIG. 12b also has the same problem of the diagonal transition that connects both sides of the barrier layer 10B2; thus the explanation regarding FIG. 13 should apply to both of the present embodiment and Non-Patent Document 1.

There is a value that becomes a measure for the overlap integral between the wavefunctions of electrons regarding levels of the diagonal transition. As an example value for the overlap integral in the conventional design THz-QCL element has been usually 0.2-0.4 when the lasing operation with the diagonal transition is intended. Based on this knowledge, it is probable that lasing may be induced if the overlap integral becomes significant and is made as much as 0.2, even for the unnecessary upper and lower lasing levels. The inventors believe that, by modifying the above knowledge according to the specific situation, we can explain the facts of the lasing operation in Non-Patent Document 1 in which the overlap integral is 0.16, and of suppression of the lasing operation in the present embodiment in which the overlap integral is 0.12, for the electronic wavefunctions between the unnecessary upper and lower lasing levels.

That is, the fact that lasing operation was actually induced for a relatively small overlap integral value of 0.16 in Non-Patent Document 1 than conventionally used range of 0.2-0.4 for the value concerning lasing operation can be explained by modifying the above mentioned range according to the situation of the weak bias that may lead to the unnecessary frequency lasing operation. To be more specific, in the case of Non-Patent Document 1, several conditions that help formation of population inversion are satisfied. The small overlap integral brings to the diagonal transition which helps the lasing, because electron-electron scattering would be suppressed by the same reason discussed with respect to the upper and lower lasing levels. In this regard, the value of 0.2 should not be an absolute lower limit for the lasing operation. In addition, for an electron in level SL5 (the unnecessary lower lasing level) the levels SL1 and SL2 in FIG. 12b act as depopulation levels by way of LO phonons. The levels SL1 and SL2 also become an injection and the unnecessary upper lasing levels respectively for the following unit structure and have almost identical energy values as indicated in FIG. 12b, allowing electrons to pass through the barrier layer 10B1 easily by RT injection. This structure has a similar level structure in levels to one of three-level type, and the lasing will be easily started. From these reasons, we suppose lasing actually occurred even for the overlap integral as small as 0.16. Moreover, these reasons also apply to the present embodiment, it follows that it is effective to set the overlap integral to 0.15 or less between the unnecessary upper and lower lasing levels in the present embodiment.

As stated above, the mechanism for suppressing the unnecessary lasing in the working examples of the present embodiment is attributed to the fact that the overlap integral between the electronic wavefunctions for the unnecessary upper and unnecessary lower lasing levels is small. Also, if the unnecessary upper and unnecessary lower levels have an overlap integral of 0.15 or less between their electronic wavefunctions under the second bias electric field, then the lasing at a frequency other than the first frequency should be suppressed.

Layers Structure Design

Next, the structure characterized by the overlap integral as set forth above will be described more specifically in terms of the layer structure in the actual element, which will be referred to as "layers structure design". In the first stage of the layers structure design, an applied voltage for a unit structure will be determined to have target lasing operation. This is because the energy differences among four levels in the unit structure are specified by reflecting above described conditions to the design. That is, the differences, one between the reception and upper lasing levels, one between the upper lasing and lower lasing levels for lasing operation, and one between the lower lasing and depopulation levels for depopulating electrons by LO phonons, are determined. The specific example values for them may be 7.8 meV 25 meV, and 36 meV respectively. With determining the barrier and well materials, thickness for each layer will be almost automatically determined in order to realize the energy differences among the four levels. Since three energy differences will be specified from the four levels, the minimum number of well layers necessary for each unit structure is concluded as 3, it follows that the minimum number of barrier layers becomes 3. The height of each potential barrier will be determined accordingly, and in turn, thickness of each well layer and each barrier layer are determined to realize the specific combination of the energy differences. The thickness of wells and barriers will be adjusted to control the arrangement of wavefunctions, because device performance will depend upon overlap integrals or the like for each wavefunction. Such a sequence of steps will be adopted to design a THz-QCL element for lasing at a target frequency. Please note that, although both the minimum numbers for the well layers and barrier layers should be 3, the description of the embodiment has been set forth in the case when the well and barrier layers are 4. In the case of four well and four barrier layers design, an energy difference between a depopulation level in a unit structure and a reception level in the following unit structure can also be adjusted, in addition to the three energy differences as mentioned above. The case for three well and three barrier layers will be described later.

The remaining degrees of freedom are taken into account for refining the design to suppress lasing at unnecessary frequencies in the THz-QCL element as designed above. It will be described by way of example. There remains one degree of freedom even after two more constraints are added in addition to keep each energy difference, where the first constrain is that the relative thickness are kept unchanged, and the second constraint is well layers and barrier layers are made of identical material, except the doped well layer. Specifically, the remaining degree of freedom is that one of material and bias electric field can be adjusted as long as either material or bias electric field is fixed and the other of them is also determined accordingly. For example, even after the constraints are satisfied, increasing the aluminum composition in barrier layers while fixing the material of the well layers will bring higher potential barriers. This increase of height of the barrier can be balanced by thinning the thickness for layers without changing relative thickness, and by increasing the bias electric field. Such re-balance would not substantially change the energy level structure, thus the requirements of the energy differences will remain satisfied. This remaining degree of freedom can be utilized to suppress the lasing at unnecessary frequencies. For example, during the initial design, after selecting a pair of levels that would be in a relationship of the unnecessary upper and lower lasing levels with each other, the overlap integral between their wavefunctions is estimated. Then determination may be made according to whether or not the estimated overlap integral becomes smaller or equal to 0.15.

It is possible to change the constraints mentioned above, because they are not given ones and are described only for explaining the design guideline in accordance with the overlap integral in the present embodiment. Simply put, each thickness for each layer can be individually changed, and material for each well layer and each barrier layer can be modified for layer by layer. For example, if we adopt plurality materials for the barrier layers, we can introduce plurality heights into the potential bathers. Then the layer structure can be modified to have smaller overlap integral value between the unnecessary upper and unnecessary lower lasing levels for a weak electric field, without affecting the diagonal transition between the upper and lower lasing levels. To be more specific, based on the structure adopted in the working example, structural part near the barrier layers 10B1 and 10B2 may be further modified. Since the barrier layer 10B1 is located between the peaks of the levels L2' and L1' as in FIG. 12a, its height and thickness can be used to adjust the degree of localization of electron in the level L2' to the well layer 10W1. This may affect the overlap integral between wavefunctions of an electron for levels L2' and L4. Also the overlap integral value may be directly changed by the height (material) or the thickness of the potential barrier 10B2, because it is located between the peaks of the levels L2' and L4. In addition to these adjustments, the bias electric field (first bias electric field) for lasing operation at the target frequency can also be adjusted to have smaller overlap integral for the wavefunctions for the levels that may be the unnecessary upper and unnecessary lower lasing levels, while maintaining the energy level structure for lasing operation at the target frequency.

Concerning the compositions especially for Al composition ratio in the well and barrier layers, the following relationship is found. First of all, there should be a certain amount of difference to Al composition ratios between the well and barrier layers in consideration of the necessary height of the potential barriers. If the difference is too small, wavefunctions for an electron among different well layers are not separated, resulting in the broadening of the wavefunctions. The minimum amount for the difference would be ~0.15. That is, for GaAs well layers, the barrier layers' minimum aluminum composition ratio should be of $Al_{0.15}Ga_{0.85}As$. There is no upper limit in the Al composition difference between the well and barrier layers.

It, should be noted that the Al composition in the well layers has an upper limit. Generally speaking, higher LO phonon energy is advantageous with respect to the higher temperature operation. However, the upper limit of the Al composition is 0.42, or $Al_{0.42}Ga_{0.58}As$ in an expression of composition ratio. This is because the electronic band becomes indirect transition type when Ails is richer than this fraction in the mixed crystal of AlAs and GaAs. On the other hand, barrier layers may be made of Al richer composition such as $Al_{0.8}Ga_{0.2}As$, or even AlAs. That is, in terms of higher potential barriers, higher Al composition ratio in the material of the barrier layers would be preferable. In this regard, upper limit for Al composition ratio does not applies to the barrier layers unlike the well layers, as the electron's probability of existence is small and therefore the effect of the electronic band structure to the barrier is also limited.

Characterization in view of the wavefunctions for the unnecessary upper and unnecessary lower lasing levels has been described in the present embodiment. The overlap integral between wavefunctions may come into question accordingly; thus there may be significant difference in possibility of lasing at unnecessary frequencies even for an extremely minor differences in the structures, such as heights of the potential barriers (i.e., combination of materials), thickness and so on. Furthermore, in the viewpoint of practicing the embodiment, such highly advanced engineering, processes will be necessary that the wavefunctions can be tailored as intended.

What to be considered for the layer structure design mentioned above can be summarized into four points as follows. First, the degree of diagonal transition between the upper and lower lasing levels should be so large that generation of the population inversion is alleviated. Second, electron-electron scattering should be suppressed to help the population inversion by increasing the degree of diagonal transition. The degree of diagonal transition for these points can be calculated by the overlap integral of Formula 1, or by a value of the ratio $f_{1',5}/f_{1',4}$ obtained by Formula 2 as a measure of the selective injection. Third, in contrast to the above, the degree of diagonal transition is made small to have significant optical gain, and the transition is made similar to the vertical one. Fourth, the level structure should be designed such that the overlap integral of wavefunctions, Formula 3, between (1) the upper and lower lasing levels, in particular the upper lasing level unnecessary lower lasing level) and (2) the reception level having higher enemy (unnecessary lower lasing level), during a weak bias electric field is applied, thereby lasing operation in three-level type should be prevented.

It is true that all of the above four points cannot be pursued at a time. However, when based on the indications such as the overlap integral given in Formulae 1-3, for example, it is possible to check the contribution of any adjustment to the final performance. Therefore, the layer structure can be optimized by adjusting the remaining degree of freedom in the course of the design process. And, as a result of such optimization, the resulting THz-QCL element can operate at a single frequency at high operation temperature. Following the four points mentioned above, the layer structure can be evolved while minimizing the burden of experimental verifications.

Three Well and Three Bather Layers

In the description set forth above, including the working example, what has been described is a structure having four well and four barrier layers in a repetition unit, or in a single unit structure. The minimum number of well and barrier layers are not 4, but 3, as mentioned above. Thus it is possible to adopt a structure having three well and three barrier layers. In such a case, fourth well layer (well layer 10W4 in FIGS. 3 and 4) and first well layer in the next unit structure should be identical. In such a layer structure, thickness for each layer will be determined from the outset.

The embodiment of the present invention has been described specifically throughout the description set forth herein. Any parts of the description in this specification, including the embodiment, practical working example, practical calculation example, and their variations, are provided for the purpose of explaining the present invention; thus the scope of the invention should be determined based on recitations of the claims. Furthermore, any other variations based on any combination in the embodiment are included in the present invention, which variations should be also within a scope of the present invention.

INDUSTRIAL APPLICABILITY

The THz-QCLs according to the present invention having a high operation temperature may be adopted in instruments that use an electromagnetic wave source of THz range.

REFERENCE SIGNS LIST

1000 element
100 QCL structure (semiconductor superlattice)
100A semiconductor superlattice (SSL)
10 active region
10B, 10B1-10B5 barrier layer
10W, 10W1-10W4 well layer
10U unit structure
120, 140 highly doped GaAs layer
160 delta-dope GaAs layer
20, 30 electrode
30A, 30B metal layer
40 receptor
50 substrate
60 etch stop layer
500 wax
L1-L6 levels.
2000 electromagnetic wave

What is claimed is:
1. A quantum cascade laser (QCL) element having a semiconductor superlattice sandwiched by a pair of electrodes,
wherein the semiconductor superlattice has an active region that emits electromagnetic waves of a first frequency in a THz range during application of an external voltage for operation through the pair of electrodes,
wherein the active region has a plurality of unit structures each of which is stacked with one another to form a multi-layered structure,
wherein each unit structure is made of first to fourth well layers that are stacked in this order and are separated from one another by at least one barrier layer, wherein an energy level structure for an electron in one unit structure of the active region during application of a first bias electric field by the external voltage comprises, at least:
  a reception level that receives an electron transported from an upstream unit structure disposed adjacent to one side of the one unit structure, wherein the reception level is corresponding to the first well layer;
  an upper lasing level that has a lower energy value than the reception level by a first energy difference associated with an LO phonon energy in a crystal lattice forming the semiconductor superlattice and receives an electron scattered by an LO phonon in the crystal lattice from the reception level, wherein the upper lasing level is corresponding to the second well layer;
  a lower lasing level that has a lower energy value than the upper lasing level by a photon energy value of an electromagnetic wave for the first frequency and receives an electron, which has lost energy due to stimulated emission, from the upper lasing level, wherein the lower lasing level is corresponding to the third well layer; and
  a depopulation level that has a lower energy value than the lower lasing level by a second energy difference associated with the LO phonon energy, receives an electron scattered by LO phonons in the crystal lattice from the lower lasing level, and transports an electron toward a downstream unit structure disposed adjacent to the other side of the one unit structure, wherein the depopulation level is corresponding to the fourth well layer, and
wherein, during application of a second bias electric field that is weaker than the first bias electric field, an unnecessary upper lasing level and an unnecessary lower lasing level are separated by an energy difference that is equivalent to a photon energy value corresponding to one of electromagnetic waves of frequencies different from the first frequency and whose wavefunctions for an electron have an overlap integral value with each other of 0.15 or less, wherein the unnecessary lasing upper level is either of the reception level or the depopulation level in the upstream unit structure and is one that will have a high probability of existence of an electron in the first well layer during application of the second bias electric field, and wherein the unnecessary lower lasing level is either of the upper lasing level or the lower lasing level and is one that will have a high probability of existence of an electron in the second well layer during application of the second bias electric field,
whereby stimulated emissions of photons are suppressed for electromagnetic waves at frequencies different from the first frequency.

2. The QCL element according to claim 1,
wherein the first to fourth well layers have a composition of $Al_xGa_{1.0-x}As$ or n-type doped $Al_xGa_{1.0-x}As$ (where, $0 \leq x \leq 0.42$), and
wherein each of the barrier layers has a composition of $Al_{0.15+x+y}Ga_{0.85-x-y}As$ (where, $0 < y \leq 0.85-x$).

3. The QCL element according to claim 1,
wherein the first to fourth well layers have a composition of GaAs or n-type doped GaAs, and
wherein each of the bather layers has a composition of $Al_{0.175}Ga_{0.825}As$.

4. The QCL element according to claim 1,
wherein the unit structure is configured such that the first energy difference exceeds 21 meV during application of the first bias electric field.

5. The QCL element according to claim 4,
wherein the unit structure is configured such that the first energy difference is greater than or equal to 25 meV during application of the first bias electric field.

6. The QCL element according to claim 1,
wherein an overlap integral between a wavefunction for an electron corresponding to the upper lasing level and a wavefunction for an electron corresponding to the lower lasing level during application of the first bias electric field is reduced,
whereby electrons are selectively injected from the reception level into the upper lasing level while suppressing electronic transition from the reception level toward the lower lasing level, and electrons shift their weighted center positions from the upstream side to the downstream side when the electrons at the upper lasing level are making optical transition to the lower lasing level.

7. The QCL element according to claim 1,
wherein a first barrier layer separating an upstream unit structure and the first well layer has a thickness of 3.95-4.0 nm,
wherein the first well layer has a thickness of 7.99-8.0 nm,
wherein a second barrier layer separating, the first well layer and the second well layer has a thickness of 2.16-2.2 nm,
wherein the second well layer has a thickness of 9.0-9.02 nm,
wherein a third barrier layer separating the second well layer and the third well layer has a thickness of 3.19-3.2 nm,
wherein the third well layer has a thickness of 6.86-6.9 nm,
wherein a fourth barrier layer separating the third well layer and the fourth well layer has a thickness of 3.76-3.8 nm,
wherein the fourth well layer has a thickness of 14.38-14.4 nm,
wherein the first to fourth well layers have a composition of GaAs or n-type doped GaAs, and
wherein each of the barrier layers has a composition of $Al_{0.175}Ga_{0.825}As$.

8. The QCL element according to claim 1,
wherein the first frequency is 2 THz or less, and
wherein stimulated emission of electromagnetic waves at a frequency that is greater than the first frequency is suppressed during application of any electric field weaker than the first bias electric field.

* * * * *